(12) United States Patent
Tanimoto

(10) Patent No.: US 10,396,057 B2
(45) Date of Patent: Aug. 27, 2019

(54) HALF-BRIDGE POWER SEMICONDUCTOR MODULE AND METHOD FOR MANUFACTURING SAME

(71) Applicant: NISSAN ARC, LTD., Kanagawa (JP)

(72) Inventor: Satoshi Tanimoto, Kanagawa (JP)

(73) Assignee: NISSAN ARC, LTD., Kanagawa (JP)

( * ) Notice: Subject to any disclaimer, the term of this patent is extended or adjusted under 35 U.S.C. 154(b) by 0 days.

(21) Appl. No.: 15/550,939

(22) PCT Filed: Feb. 13, 2015

(86) PCT No.: PCT/JP2015/053941
§ 371 (c)(1),
(2) Date: Aug. 14, 2017

(87) PCT Pub. No.: WO2016/129097
PCT Pub. Date: Aug. 18, 2016

(65) Prior Publication Data
US 2018/0240787 A1    Aug. 23, 2018

(51) Int. Cl.
*H01L 25/07* (2006.01)
*H01L 23/00* (2006.01)
(Continued)

(52) U.S. Cl.
CPC ........... *H01L 25/072* (2013.01); *H01L 24/40* (2013.01); *H01L 24/49* (2013.01); *H01L 25/18* (2013.01);
(Continued)

(58) Field of Classification Search
CPC .................. H01L 25/072; H01L 24/40; H01L 2224/49175; H01L 2224/49431
See application file for complete search history.

(56) References Cited

U.S. PATENT DOCUMENTS 4,819,042 A * 4/1989 Kaufman .......... H01L 23/49575
257/676
5,347,158 A * 9/1994 Matsuda ............... H01L 23/645
257/691
(Continued)

FOREIGN PATENT DOCUMENTS

CN    102195458 A    9/2011
JP    2002-076256 A    3/2002
(Continued)

OTHER PUBLICATIONS

Machine translation, Kuno, Japanese Pat. Pub. No. JP 2005-192328, translation date: Oct. 6, 2018, Espacenet, all pages.*

*Primary Examiner* — Victoria K. Hall
(74) *Attorney, Agent, or Firm* — Osha Liang LLP

(57) ABSTRACT

A half-bridge power semiconductor module has an insulating wiring substrate including a single insulating plate, and a positive electrode wiring conductor, a bridge wiring conductor, and a negative electrode wiring conductor disposed on or above the insulating plate while being electrically isolated from one another, at least one high side power semiconductor device having a rear surface electrode bonded onto the positive electrode wiring conductor, at least one low side power semiconductor device having a rear surface electrode bonded onto the bridge wiring conductor, a stand-up bridge terminal connected to the bridge wiring conductor, a stand-up high side terminal disposed between the high side power semiconductor device and the bridge terminal, and connected to the positive electrode wiring conductor, and a stand-up low side terminal disposed between the bridge terminal and the low side power semiconductor device, and connected to the negative electrode wiring conductor.

18 Claims, 14 Drawing Sheets

(51) Int. Cl.
*H01L 25/18* (2006.01)
*H01L 23/48* (2006.01)
*H01L 23/52* (2006.01)
*H01L 23/58* (2006.01)

(52) U.S. Cl.
CPC .............. *H01L 2224/05554* (2013.01); *H01L 2224/0603* (2013.01); *H01L 2224/48227* (2013.01); *H01L 2224/48472* (2013.01); *H01L 2224/49175* (2013.01); *H01L 2224/49431* (2013.01); *H01L 2924/00014* (2013.01)

(56) References Cited

U.S. PATENT DOCUMENTS

| | | | |
|---|---|---|---|
| 7,468,560 B2 * | 12/2008 | Guengerich | H05K 1/0243 257/784 |
| 8,526,199 B2 | 9/2013 | Matsumoto et al. | |
| 9,106,124 B2 | 8/2015 | Bayerer et al. | |
| 2002/0047132 A1 | 4/2002 | Fukada et al. | |
| 2002/0186545 A1 * | 12/2002 | Fukada | H01L 23/473 361/719 |
| 2004/0113268 A1 | 6/2004 | Shirakawa et al. | |
| 2004/0227231 A1 * | 11/2004 | Maly | H01L 25/072 257/724 |
| 2005/0024805 A1 * | 2/2005 | Heilbronner | H01L 24/49 361/100 |
| 2006/0244116 A1 | 11/2006 | Tsunoda | |
| 2007/0228413 A1 * | 10/2007 | Bayerer | H01L 23/49811 257/181 |
| 2009/0085219 A1 * | 4/2009 | Bayerer | H01L 24/48 257/776 |
| 2010/0013085 A1 * | 1/2010 | Oi | H01L 23/3121 257/693 |
| 2011/0101515 A1 * | 5/2011 | Beaupre | H01L 24/49 257/691 |
| 2011/0273861 A1 | 11/2011 | Matsumoto et al. | |
| 2013/0285231 A1 * | 10/2013 | Kodaira | H01L 23/34 257/693 |
| 2014/0167235 A1 * | 6/2014 | Horie | H01L 23/049 257/669 |
| 2014/0346659 A1 * | 11/2014 | Nakamura | H02M 7/003 257/704 |
| 2014/0346676 A1 * | 11/2014 | Horio | H01L 25/18 257/773 |
| 2014/0361424 A1 * | 12/2014 | Horio | H02M 7/003 257/704 |
| 2016/0344301 A1 * | 11/2016 | Maruyama | H02M 7/48 |
| 2016/0358895 A1 * | 12/2016 | Nakashima | H01L 23/3735 |
| 2017/0294373 A1 * | 10/2017 | Rowden | H01L 24/49 |
| 2017/0345792 A1 * | 11/2017 | Tanimoto | H01L 25/0655 |

FOREIGN PATENT DOCUMENTS

| | | | | |
|---|---|---|---|---|
| JP | 2002-112559 A | | 4/2002 | |
| JP | 2002-373971 A | | 12/2002 | |
| JP | 2005-192328 | * | 7/2005 | ............. H02M 1/00 |
| JP | 2005-192328 A | | 7/2005 | |
| JP | 2006-313821 A | | 11/2006 | |
| JP | 2008-91809 A | | 4/2008 | |
| JP | 2008-306872 A | | 12/2008 | |
| JP | 2011-238691 A | | 11/2011 | |

* cited by examiner

FIG. 1A
(a)
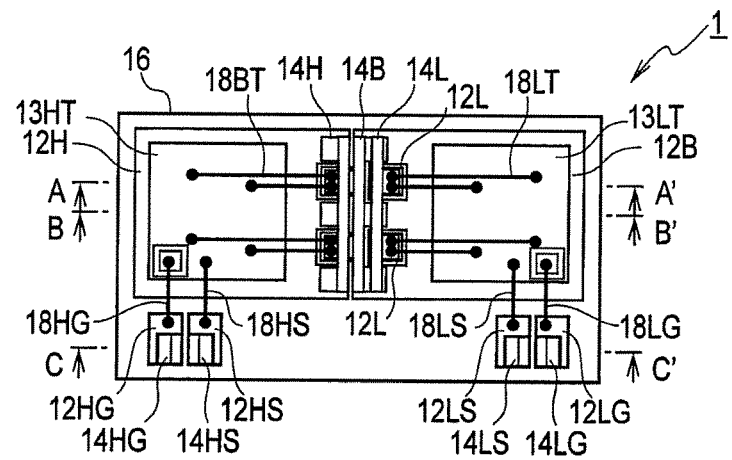
(b)
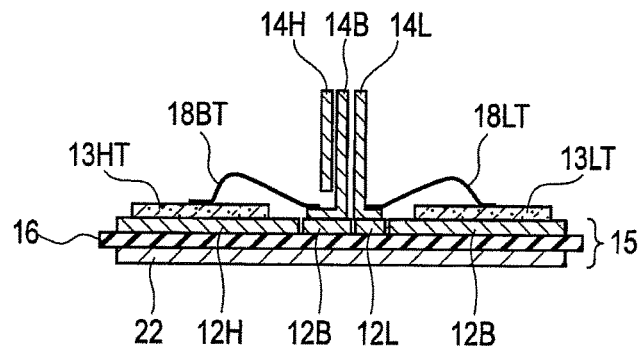
(c)
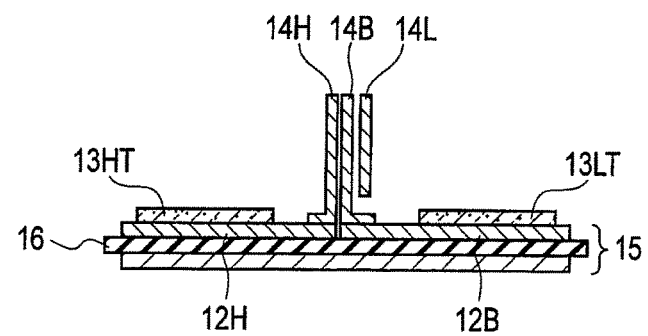

FIG. 1B
(a)
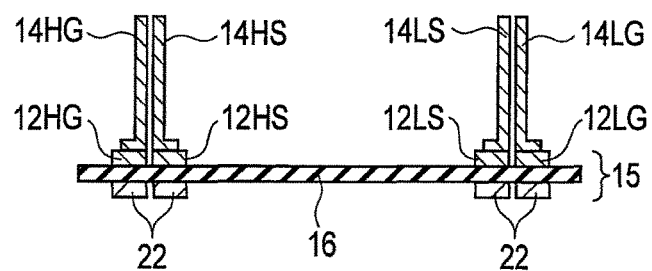
(b)
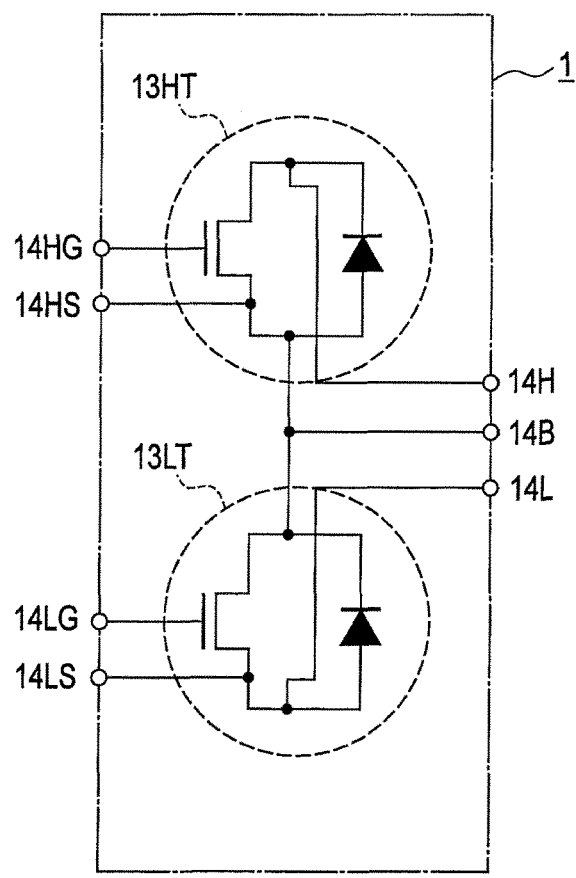

FIG. 2
(a)
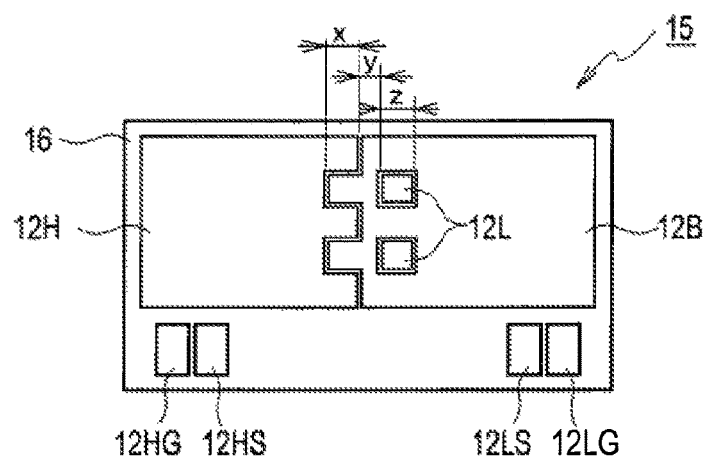
(b)
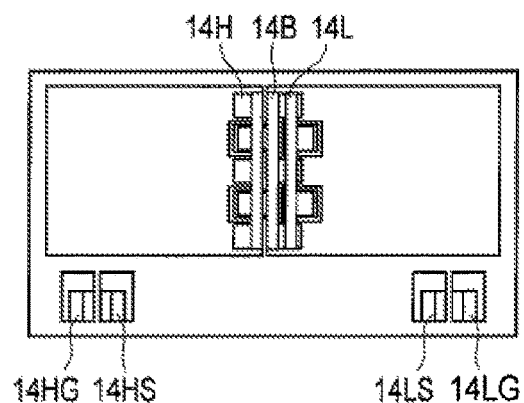
(c)
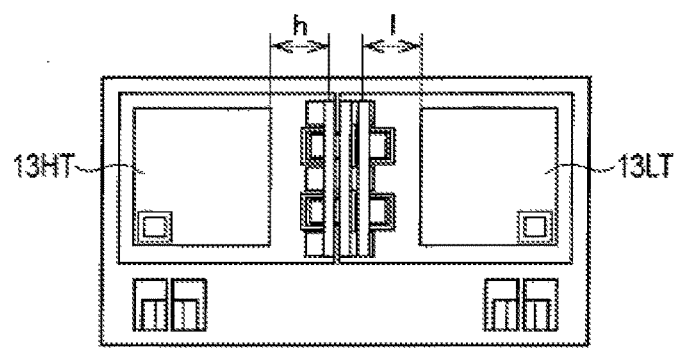

FIG. 3A
(a)
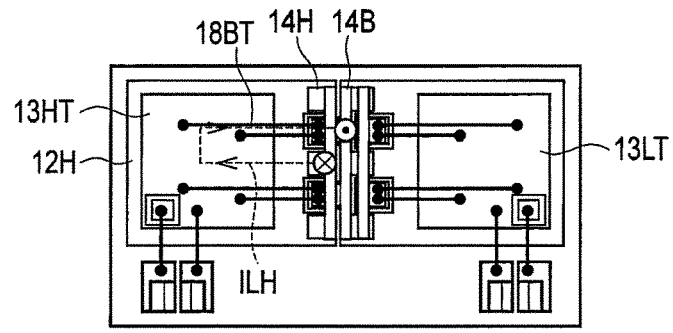
(b)
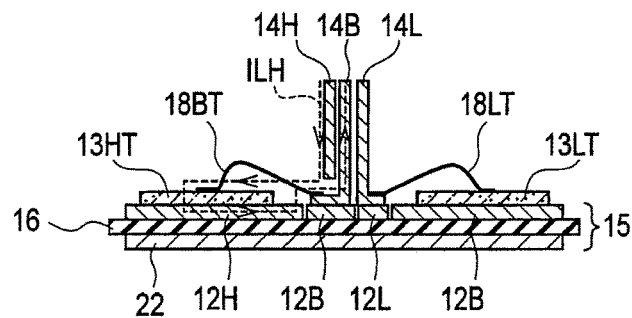
(c)
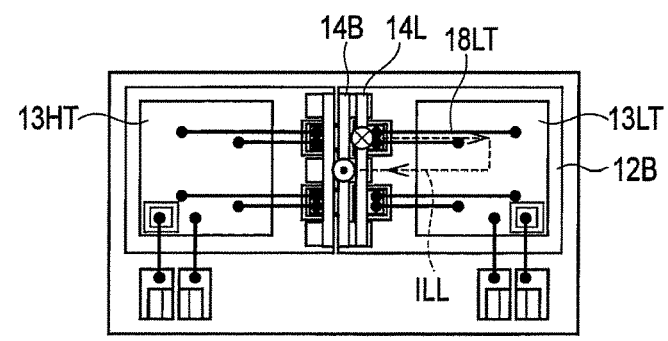
(d)
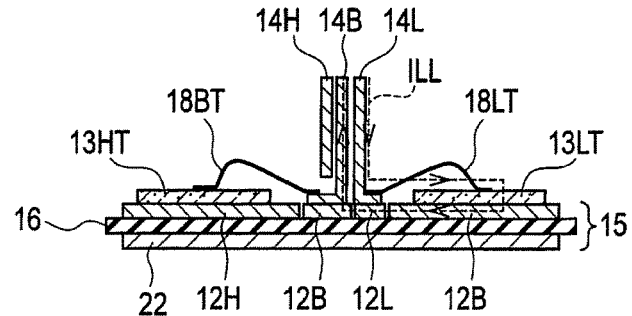

FIG. 3B
(a)
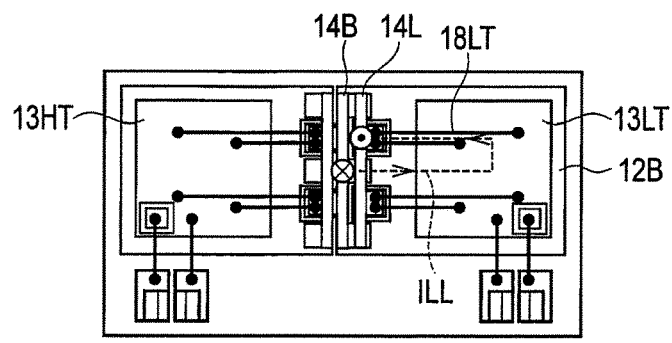
(b)
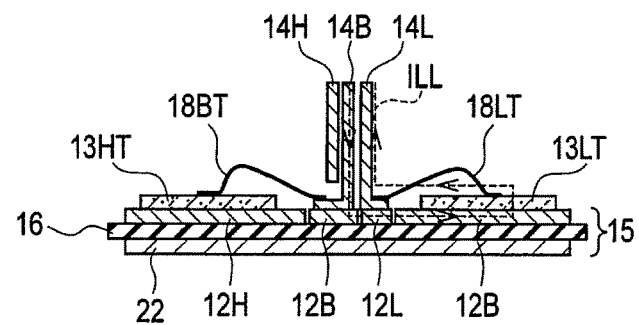
(c)
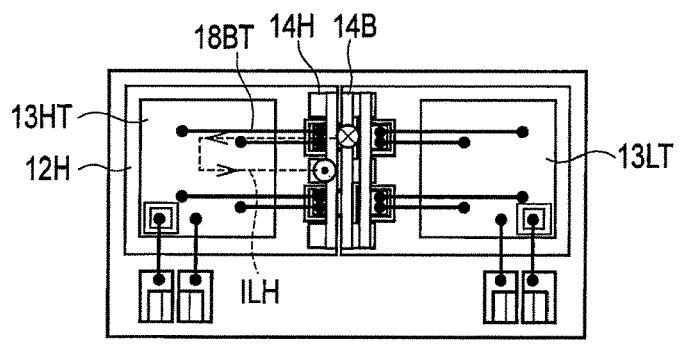
(d)
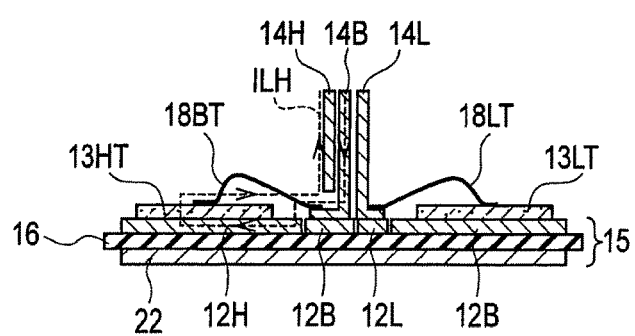

FIG. 4A
(a)
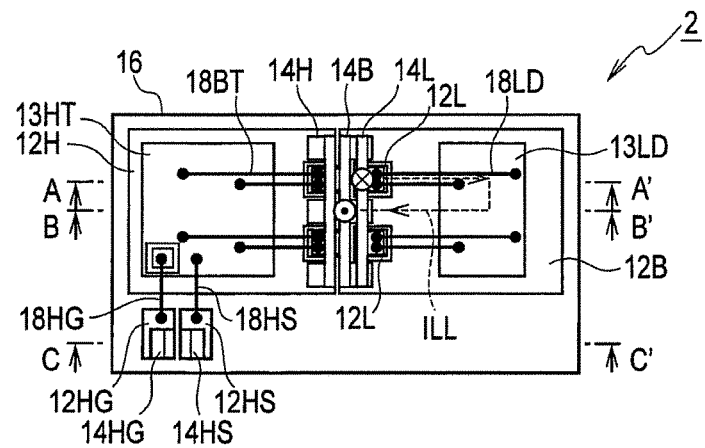
(b)
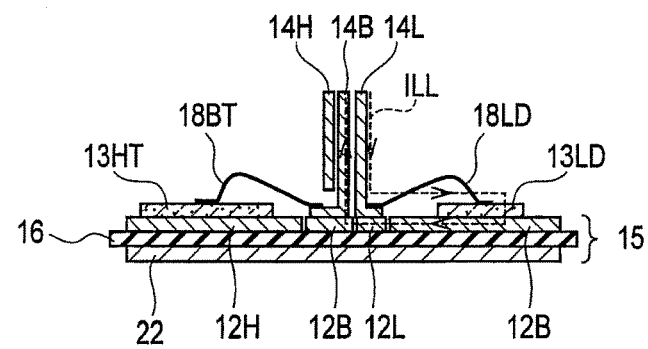
(c)
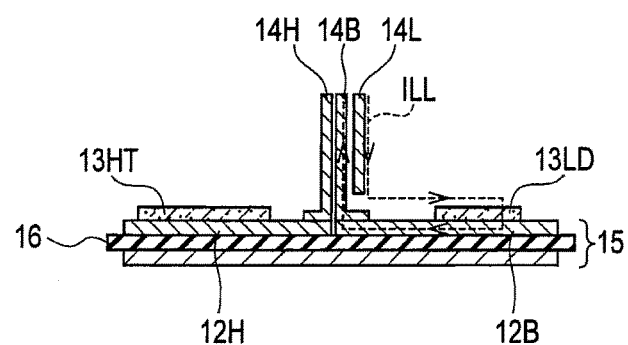

FIG. 4B
(a)
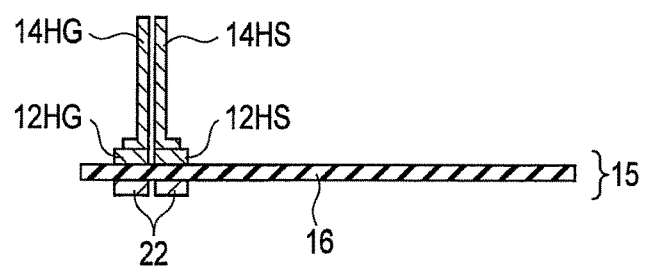
(b)
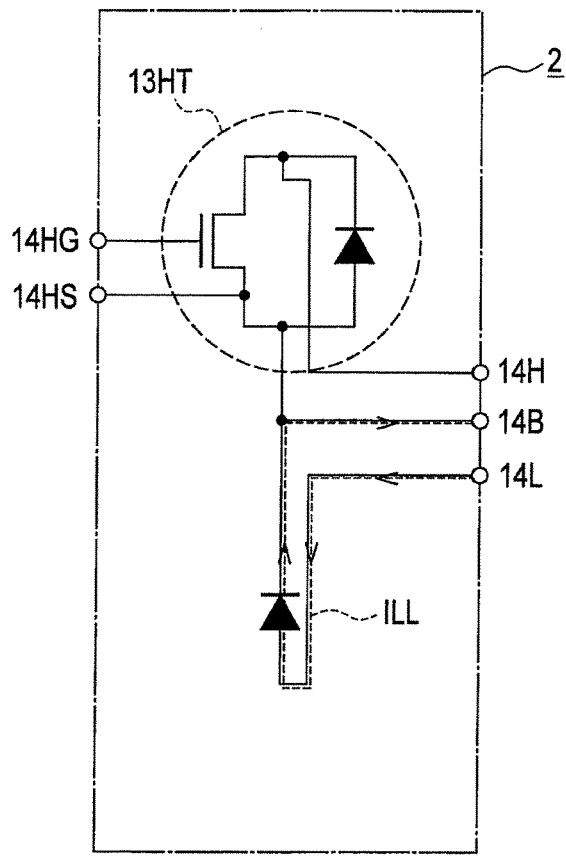

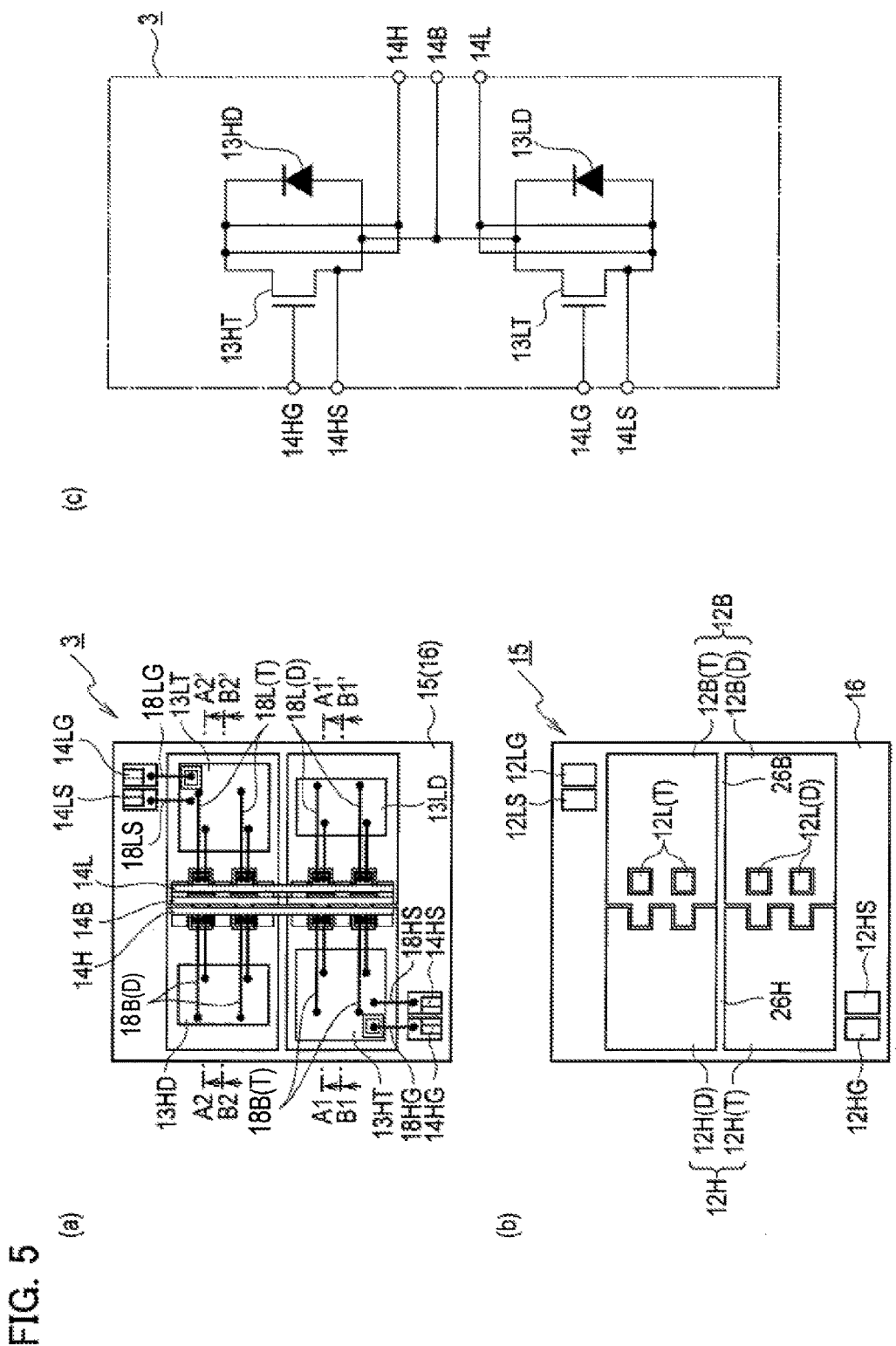

FIG. 7
(a)
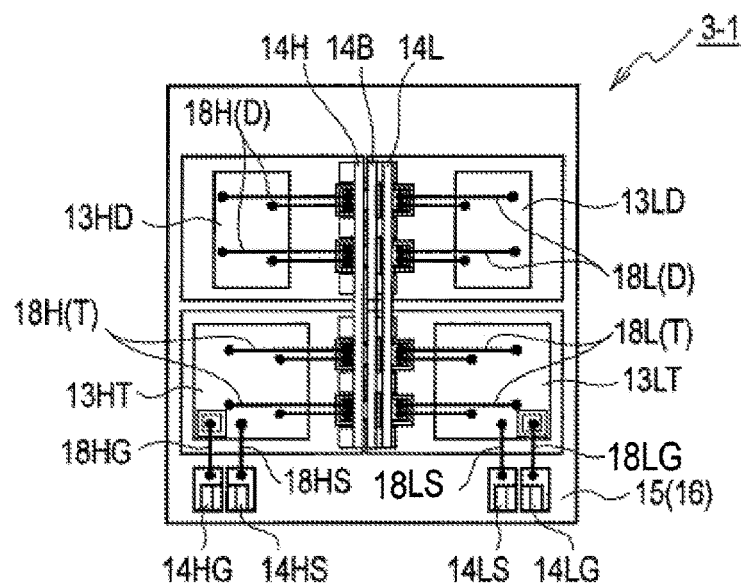
(b)
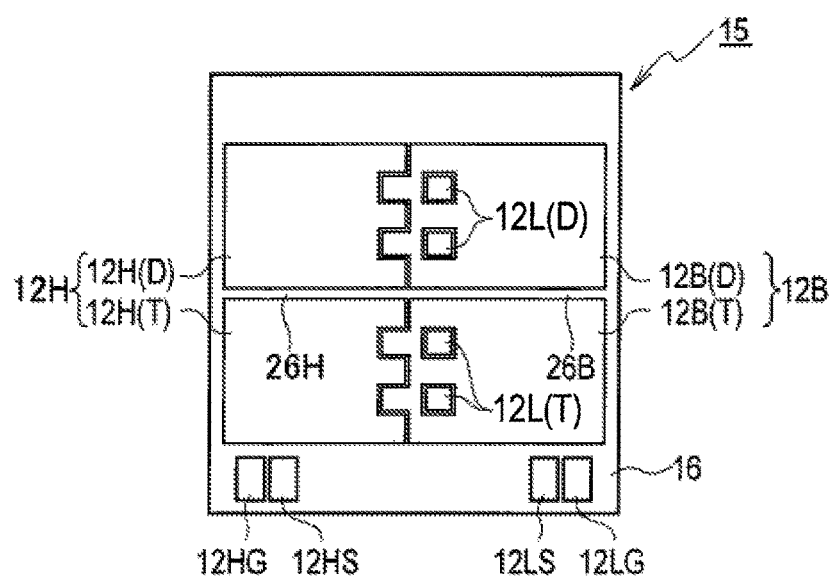

FIG. 8A
(a)
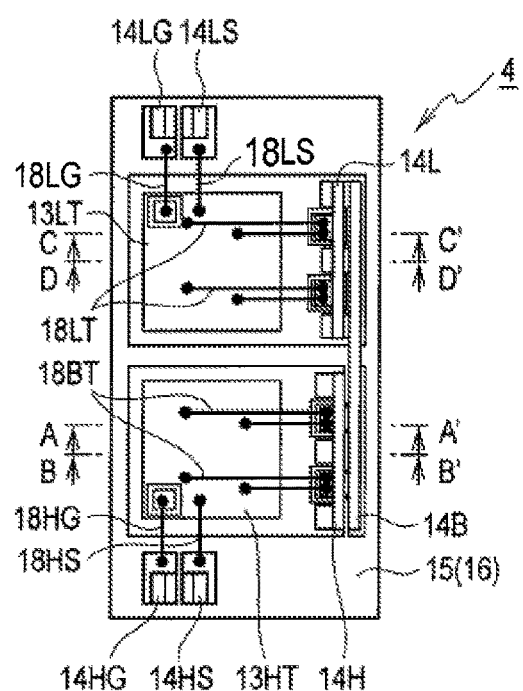
(b)
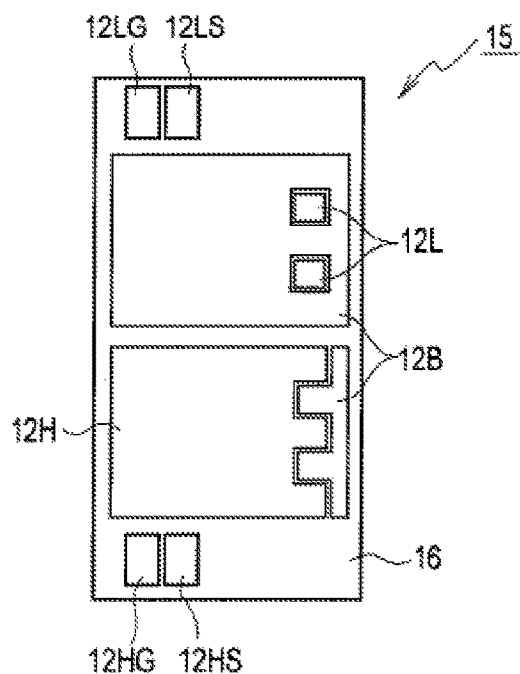

FIG. 8B
(a)
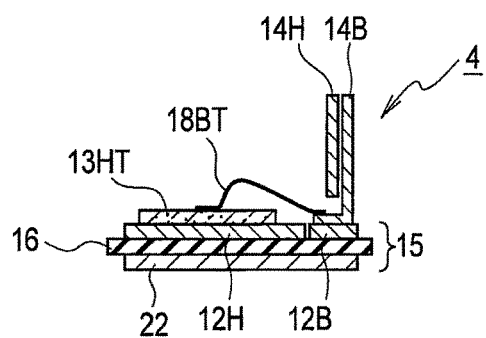
(b)
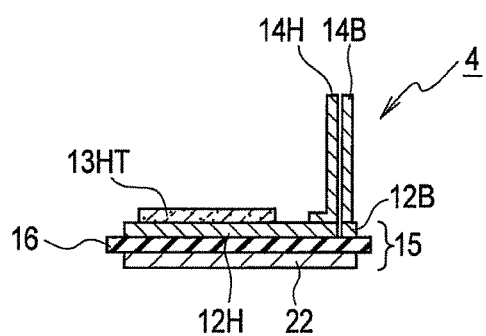
(c)
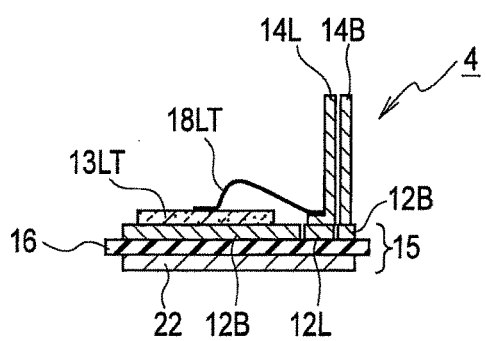
(d)
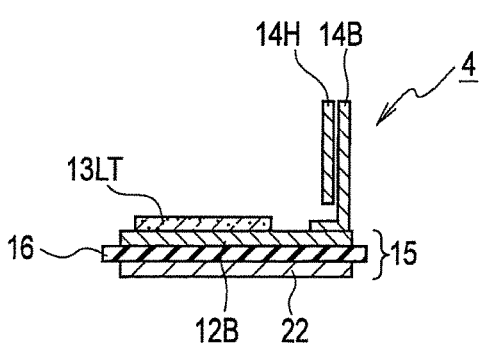

FIG. 9
(a) 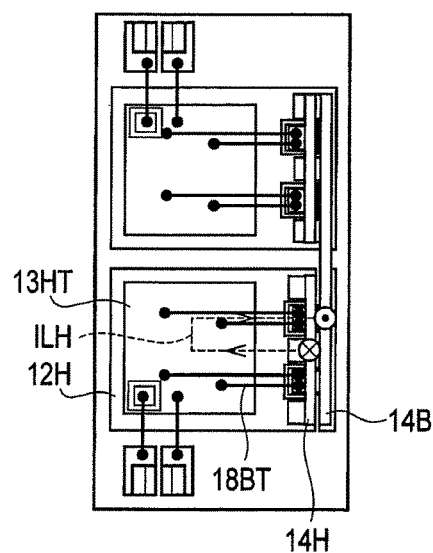
(b) 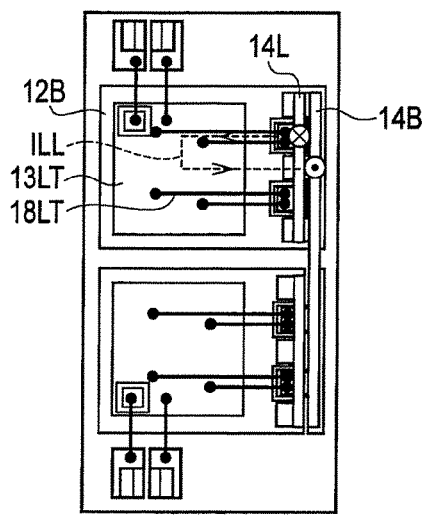
(c) 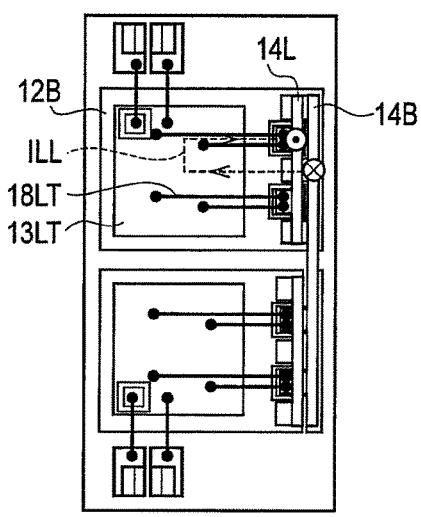
(d) 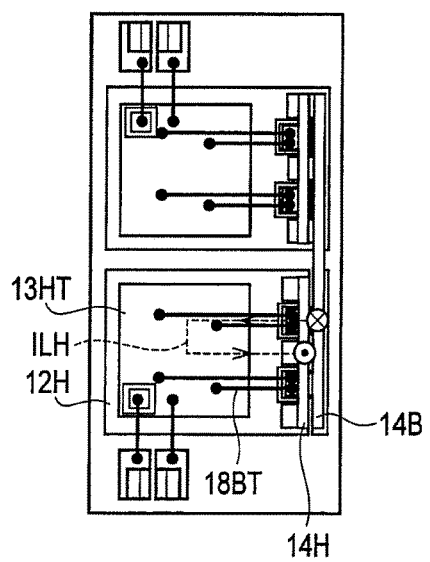

HALF-BRIDGE POWER SEMICONDUCTOR MODULE AND METHOD FOR MANUFACTURING SAME

BACKGROUND

Technical Field

The present invention relates to a high-density half-bridge power semiconductor module capable of significantly reducing parasitic inductance, which may occur on a path of a main current, without increasing thermal resistance and to a method for manufacturing the same.

Related Art

There is a widely-known half-bridge power semiconductor module (hereinafter abbreviated as a power module when appropriate) that houses a half-bridge circuit in one package, in which the half-bridge circuit is formed by connecting two power semiconductor devices in series and locating an output terminal at a connection midpoint of the two power semiconductor devices (See Patent Literature 1 and 2). In Patent Literature 1 and 2, parasitic inductance of the power module is reduced by adopting an "adjacent antiparallel conduction" layout, in which a main current flowing on a front surface side conductor of an insulating plate and a main current flowing on a rear surface side conductor of the insulating plate are directed opposite to each other.

Patent Literature 1: Japanese Patent Application Publication No. 2002-112559
Patent Literature 2: Japanese Patent Application Publication No. 2002-373971

SUMMARY OF INVENTION

However, the power module according to each of Patent Literature 1 and 2 adopts a structure in which the rear surface side conductor is further provided with another insulating substrate on its rear surface side in order to dissipate internally generated heat from the rear surface side of the original insulating plate, thereby causing an increase in thermal resistance of the power module. This becomes more serious when a water-cooling method is adopted as a cooling method.

A high-density half-bridge power semiconductor module according to one or more embodiments of the present invention is capable of reducing parasitic inductance, which may occur on a path of a main current, without increasing thermal resistance and to provide a method for manufacturing the same.

A half-bridge power semiconductor module according to one or more embodiments of the present invention includes an insulating wiring substrate having a positive electrode wiring conductor, a bridge wiring conductor, and a negative electrode wiring conductor which are disposed on or above a single insulating plate while being electrically isolated from one another. Rear surface electrodes of a high side power semiconductor device and of a low side power semiconductor device are bonded onto the positive electrode wiring conductor and the bridge wiring conductor, respectively. A stand-up bridge terminal is bonded onto the bridge wiring conductor. A stand-up high side terminal is located between the high side power semiconductor device and the stand-up bridge terminal, and is bonded onto the positive electrode wiring conductor. A stand-up low side terminal is located between the low side power semiconductor device and the stand-up bridge terminal, and is bonded onto the negative electrode wiring conductor. At least the pair of the stand-up bridge terminal and the stand-up high side terminal, and the pair of the stand-up bridge terminal and the stand-up low side terminal are disposed adjacent and parallel to each other, respectively. Front surface electrodes of the high side power semiconductor device and of the low side power semiconductor device are connected to the stand-up bridge terminal and the stand-up low side terminal through a high side connector and a low side connector.

BRIEF DESCRIPTION OF DRAWINGS

FIG. 1A(a) is a plan view showing a structure of a half-bridge power semiconductor module 1 according to a first embodiment, FIG. 1A(b) is a cross-sectional view taken along the A-A' cutting plane in FIG. 1A(a), and FIG. 1A(c) is a cross-sectional view taken along the B-B' cutting plane in FIG. 1A(a).

FIG. 1B(a) is a cross-sectional view taken along the C-C' cutting plane in FIG. 1A(a), and FIG. 1B(b) is a circuit representation diagram of the half-bridge power semiconductor module 1.

FIGS. 2(a) to 2(c) are plan views explaining first to third steps concerning a method for manufacturing the half-bridge power semiconductor module 1 in FIG. 1, respectively.

FIGS. 3A(a) and 3A(b) show a main current ILH that flows when a high side power semiconductor device (a switch) 13HT in FIG. 1 is turned on, and FIGS. 3A(c) and 3A(d) show a main current (a commutation current) ILL that flows on a built-in diode of a low side power semiconductor device (a switch) 13LT in FIG. 1.

FIGS. 3B(a) and 3B(b) show a main current ILL that flows when the low side power semiconductor device (the switch) 13LT in FIG. 1 is turned on, and FIGS. 3B(c) and 3B(d) show a main current (a commutation current) ILH that flows on a built-in diode of the high side power semiconductor device (the switch) 13HT in FIG. 1.

FIG. 4A(a) is a plan view showing a structure of a half-bridge power semiconductor module 2 according to a second embodiment, FIG. 4A(b) is a cross-sectional view taken along the A-A' cutting plane in FIG. 4A(a), and FIG. 4A(c) is a cross-sectional view taken along the B-B' cutting plane in FIG. 4A(a).

FIG. 4B(a) is a cross-sectional view taken along the C-C' cutting plane in FIG. 4A(a), and FIG. 4B(b) is a circuit representation diagram of the half-bridge power semiconductor module 2.

FIG. 5(a) is a plan view showing a structure of a half-bridge power semiconductor module 3 according to a third embodiment, FIG. 5(b) is a plan view showing a structure of an insulating wiring substrate 15 in FIG. 5(a), and FIG. 5(c) is a circuit representation diagram of the half-bridge power semiconductor module 3.

FIG. 7(a) is a plan view showing a structure of a half-bridge power semiconductor module 3-1 according to a modified example of the third embodiment, and FIG. 7(b) is a plan view showing a structure of an insulating wiring substrate 15 in FIG. 7(a).

FIG. 8A(a) is a plan view showing a structure of a half-bridge power semiconductor module 4 according to a fourth embodiment, and FIG. 8A(b) is a plan view showing a structure of an insulating wiring substrate 15 in FIG. 8A(a).

FIG. 8B(a) is a cross-sectional view taken along the A-A' cutting plane in FIG. 8A(a), FIG. 8B(b) is a cross-sectional view taken along the B-B' cutting plane in FIG. 8A(a), FIG. 8B(c) is a cross-sectional view taken along the C-C' cutting plane in FIG. 8A(a), and FIG. 8B(d) is a cross-sectional view taken along the D-D' cutting plane in FIG. 8A(a).

FIG. 9(a) shows a main current ILH that flows when a high side power semiconductor device (a switch) 13HT in FIG. 8A is turned on, FIG. 9(b) shows a main current (a commutation current) ILL that flows on a built-in diode of a low side power semiconductor device (a switch) 13LT in FIG. 8A, FIG. 9(c) shows a main current ILL that flows when the low side power semiconductor device (the switch) 13LT in FIG. 8A is turned on, and FIG. 9(d) shows a main current (a commutation current) ILH that flows on a built-in diode of the high side power semiconductor device (a diode) 13HT in FIG. 8A.

DETAILED DESCRIPTION

Figure 6:
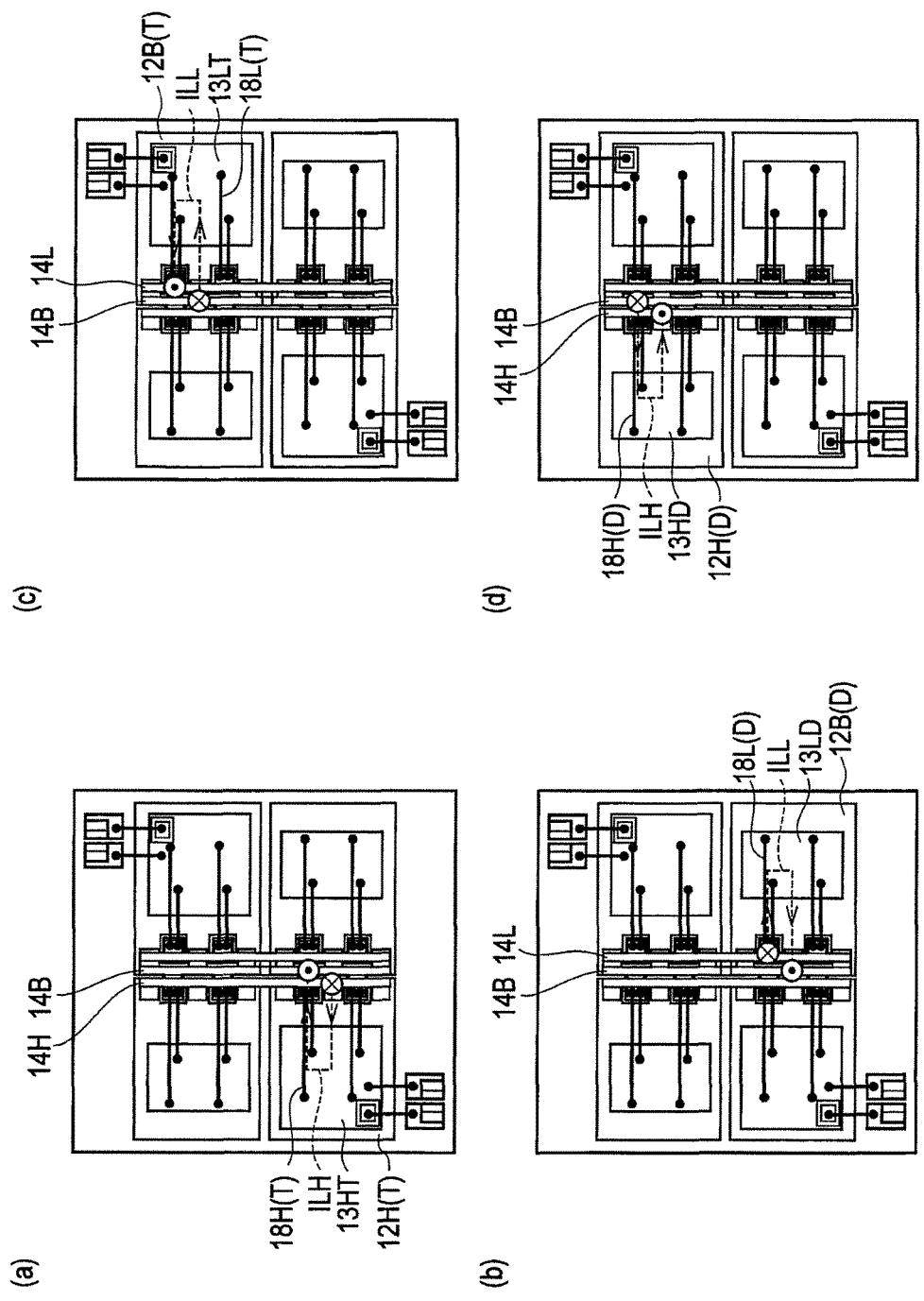
FIG. 6(a) shows a main current ILH that flows when a high side power semiconductor device (a switch) 13HT in FIG. 5 is turned on, FIG. 6(b) shows a main current (a commutation current) ILL that flows on a low side power semiconductor device (a diode) 13LT in FIG. 5.
FIG. 6(c) shows a main current ILL that flows when the low side power semiconductor device (the switch) 13LT in FIG. 5 is turned on, and FIG. 6(d) shows a main current (a commutation current) ILH that flows on a high side power semiconductor device (a diode) 13HD in FIG. 5.

Embodiments of the present invention and modified examples thereof will be described below with reference to the drawings. It is to be noted that while a configuration of a half-bridge power semiconductor module will be schematically described below, these schematic drawings illustrate relations between thickness and plane dimensions, thickness ratios among respective layers, and so forth in an exaggerated manner in order to facilitate the understanding. In addition, the same members are denoted by the same reference signs in principle and repeated description thereof will be omitted. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

First Embodiment

A structure of a half-bridge power semiconductor module 1 according to a first embodiment will be described with reference to FIGS. 1A(a)-1A(c), 1B (a)-1B (b), and 2(a)-2(c). FIG. 1A(a) is a plan view, FIG. 1A(b) is a cross-sectional view taken along the A-A' cutting line in FIG. 1A(a), FIG. 1A(c) is a cross-sectional view taken along the B-B' cutting line in FIG. 1A(a), and FIG. 1B(a) is a cross-sectional view taken along the C-C' cutting line in FIG. 1A(a). FIG. 1B(b) is a circuit representation diagram of the half-bridge power semiconductor module 1. FIGS. 2(a) to 2(c) are plan views showing a main manufacturing process for the half-bridge power semiconductor module 1.

The half-bridge power semiconductor module 1 includes: an insulating wiring substrate 15 having a laminate structure; a high side power semiconductor device (a switch) 13HT and a low side power semiconductor device (a switch) 13LT disposed electrically insulated from each other; a bridge terminal 14B; a high side terminal 14H; a low side terminal 14L; a high side connector 18BT which connects the high side power semiconductor device (the switch) 13HT to the bridge terminal 14B; and a low side connector 18LT which connects the bridge terminal 14B to the low side power semiconductor device (the switch) 13LT, which are disposed on the surface of the insulating wiring substrate 15.

While an example of each of the high side connector 18BT and the low side connector 18LT is a set of bonding wires as shown in FIGS. 1A(a)-1B(b), it is also possible to use other connectors including bonding ribbons, lead frames, and the like. Here, in light of reducing electric resistance and parasitic inductance as much as possible, the connectors 18BT and 18LT are optimized to have as large a cross-sectional area, as large a surface area, as low a ground height, and as many strands (in the case of bonding wires) as possible to the extent that machining constraints, mechanical strength, and long-term fatigue resistance are not damaged.

[Insulating Wiring Substrate 15]

The insulating wiring substrate 15 includes a single insulating plate 16, and multiple wiring conductors (12H, 12B, 12L, 12HG, 12HS, 12LG, and 12LS) that are disposed on a front surface of the insulating plate 16 while being electrically insulated from one another. The multiple wiring conductors include a positive electrode wiring conductor 12H, a bridge wiring conductor 12B, negative electrode wiring conductors 12L, gate signal wiring conductors (12HG and 12LG), and source signal wiring conductors (12HS and 12LS). These wiring conductors are bonded onto the front surface of the insulating plate 16, respectively, by direct copper bonding, active metal bonding, and the like.

FIG. 2(a) is a plan view of the insulating wiring substrate 15. As shown in FIGS. 1A(a) and 2(a), each negative electrode wiring conductor 12L is surrounded by the bridge wiring conductor 12B with a clearance therebetween when viewed in a normal direction to a principal surface of the insulating plate 16. The low side terminal 14L is bonded to the negative electrode wiring conductors 12L. A boundary portion (see FIG. 2(a)) between the positive electrode wiring conductor 12H and the bridge wiring conductor 12B is provided with protrusions which bilaterally protrude toward respective regions. The high side terminal 14H is bonded to the protrusions of the positive electrode wiring conductor 12H while the bridge terminal 14B is bonded to the protrusions of the bridge wiring conductor 12B.

As shown in FIG. 2(a), a depth (x) of each protrusion of the positive electrode wiring conductor 12H, a horizontal distance (y) between a tip of this protrusion and the negative electrode wiring conductors 12L, and a length (z) of each negative electrode wiring conductor 12L are important design parameters of the insulating wiring substrate 15. The parameters x, y, and z are designed based on given requirements in such a way as to minimize a total value (x+y+z). The bridge terminal 14B is disposed at a midpoint of the horizontal distance (y). Here, it is also possible to adopt a design that satisfies y=0.

In light of preventing the substrate from warpage attributed a thermal stress arising in the middle of a manufacturing process for the power module, according to one or more embodiments of the present invention, the insulating wiring substrate 15 includes a thermal strain relaxation conductor 22 attached to a rear surface of the insulating plate 16.

The insulating plate 16 is made of a ceramic plate such as a silicon nitride (SiN), aluminum nitride (AlN), and alumina, or a withstand voltage resin sheet attached to a base plate, for example. In order to reduce thermal resistance of the insulating plate 16 as much as possible, it is desirable to set a thickness of the insulating plate 16 to the smallest thickness that satisfies the withstand voltage, the mechanical strength, and the long-term fatigue resistance. For example, if an instantaneous withstand voltage of 1.2 kV is required, then the thickness of the insulating plate 16 falls in a range from 0.2 to 1.5 mm. To be more precise, in the case of a SiN plate, it is possible to achieve a thickness of about 0.31 mm while taking the mechanical strength into account.

According to one or more embodiments of the present invention, each of the above-described wiring conductors (12H, 12B, 12L, 12HG, 12HS, 12LG, and 12LS) on the front surface has a flat plate shape, and is formed of a metal plate piece of Cu, Al or the like of which surface is plated with Ni in order to impart oxidation resistance. According to one or more embodiments of the present invention, surfaces of the bridge terminal 14B, the high side terminal 14H, and the low side terminal 14L are plated with Ni as well.

[High Side Power Semiconductor Device 13HT and Low Side Power Semiconductor Device 13LT]

In the first embodiment, as shown in FIG. 1A(c), each of the high side power semiconductor device 13HT and the low side power semiconductor device 13LT is a unipolar power switching element such as a MOSFET and a junction FET, which has a built-in reverse conducting diode. Each of the high side power semiconductor device 13HT and the low side power semiconductor device 13LT includes a gate electrode, to which a control signal (a gate signal) is inputted for switching between a state (an on-state) of conduction between a front surface electrode and a rear surface electrode and a state (an off-state) of shut-off therebetween.

A front surface electrode (a source electrode) is formed on a front surface of the high side power semiconductor device 13HT and a rear surface electrode (a drain electrode) is formed on a rear surface thereof. The rear surface electrode is brought into ohmic contact with (hereinafter simply referred to as "connected to") the positive electrode wiring conductor 12H with solder and the like. On the other hand, the front surface electrode of the high side power semiconductor device 13HT is connected to the bridge terminal 14B through the high side connector 18BT (multiple bonding wires in FIGS. 1A(a)-1A(c), for example).

Likewise, a front surface electrode (a source electrode) and a rear surface electrode (a drain or collector electrode) are formed on the low side power semiconductor device 13LT as well. The rear surface electrode is connected to the bridge wiring conductor 12B with solder and the like. On the other hand, the front surface electrode of the low side power semiconductor device 13LT is connected to the low side terminal 14L through the low side connector 18BT (multiple bonding wires in FIGS. 1A(a)-1A(c), for example).

Moreover, the gate electrodes disposed on the front surfaces of the respective semiconductor devices (13HT and 13LT) are connected to the gate signal wiring conductors 12HG and 12LG (or gate signal terminals 14HG and 14LG) through gate signal connectors 18HG and 18LG (which are bonding wires in FIGS. 1A(a)-1A(c), for example). Likewise, the source electrodes on the front surfaces of the respective semiconductor devices (13HT and 13LT) are connected to the source signal wiring conductors 12HS and 12LS (or source signal terminals 14HS and 14LS) through source signal connectors 18HS and 18LS (which are bonding wires in FIGS. 1A(a)-1B(b), for example). Note that aside from the bonding wires, bonding ribbons and lead frames can be used for the gate signal connectors and the source signal connectors.

[Bridge Terminal 14B, High Side Terminal 14H, and Low Side Terminal 14L]

Each terminal among the bridge terminal 14B, the high side terminal 14H; the low side terminal 14L, the gate signal terminals 14HG and 14LG, and the source signal terminals 14HS and 14LS is a stand-up terminal which stands up vertically from the front surface of the insulating wiring substrate 15. As said before, it is apparent with reference to the cross-sectional views in FIGS. 1A(b), 1A(c), and 1B(a) that a cross section of a substantial part of each terminal is L-shaped. The bridge terminal 14B is connected to the bridge wiring conductor 12B and stands up from the bridge wiring conductor 12B. Likewise, the high side terminal 14H and the low side terminal 14L are connected to the positive electrode wiring conductor 12H and the negative electrode wiring conductor 12L and stand up from the positive electrode wiring conductor 12H and the negative electrode wiring conductor 12L, respectively. The bridge terminal 14B corresponds to a "stand-up bridge terminal", the high side terminal 14H corresponds to a "stand-up high side terminal", the low side terminal 14L corresponds to a "stand-up low side terminal", each of the gate signal terminals 14HG and 14LG corresponds to a "stand-up gate signal terminal", and each of the source signal terminals 14HS and 14LS corresponds to a "stand-up source signal terminal".

The high side terminal 14H is disposed between the high side power semiconductor device 13HT and the bridge terminal 14B, and is disposed adjacent and parallel to the bridge terminal 14B. The low side terminal 14L is disposed between the low side power semiconductor device 13LT and the bridge terminal 14B, and is disposed adjacent and parallel to the bridge terminal 14B. In light of preventing discharge and preventing contact, according to one or more embodiments of the present invention, insulating members (not shown) are interposed between the high side terminal 14H and the bridge terminal 14B as well as between the bridge terminal 14B and the low side terminal 14L, respectively.

As shown in FIG. 2(c), a distance (h) between the high side power semiconductor device 13HT and the high side terminal 14H, and a distance (l) between the low side power semiconductor device 13LT and the low side terminal 14L are important design parameters that define the size, the magnitude of parasitic inductance, a heat dissipation performance, and ease of assembly of the half-bridge power semiconductor module 1. In order to bring the structure in FIG. 2(c) into being, at least h>x and l>z must be satisfied. It is desirable that h=l be satisfied in order to reduce imbalance between parasitic inductance in a high side region and parasitic inductance in a low side region. Furthermore, in order to reduce the parasitic inductance and the module size, it is desirable to provide the distance (h) and the distance (l) as small as possible so far as other design requirements permit.

As shown in FIG. 1A(d), the gate signal terminal 14HG and the source signal terminal 14HS are stand-up terminals of a flat plate shape, which are connected to the gate signal wiring conductor 12HG and the source signal wiring conductor 12HS on the front surface of the insulating wiring substrate 15 and stand up from these wiring conductors. The gate signal terminal 14LG and the source signal terminal 14LS are stand-up terminals of a flat plate shape, which are connected to the gate signal wiring conductor 12LG and the source signal wiring conductor 12LS and stand up from these wiring conductors. The gate signal terminals (14HG and 14LG) are disposed adjacent and parallel to the counterpart source signal terminals (14HS and 14LS), respectively. This layout exerts a desirable effect to reduce parasitic inductance on gate signal lines.

In this embodiment, the high side power semiconductor device 13HT and the low side power semiconductor device 13LT are assumed to be controlled in such a way as to be turned on exclusively. Nonetheless, it is possible to turn on (ground) the high side power semiconductor device 13HT and the low side power semiconductor device 13LT at the same time.

[Method for Manufacturing Half-bridge Power Semiconductor Module 1]

Next, an example of a method for manufacturing the half-bridge power semiconductor module 1 shown in FIGS. 1A(a)-1A(b) and 1B(a)-1B(b) will be described by using FIGS. 2(*a*) to 2(*c*).

As shown in FIG. 2(*a*), the insulating wiring substrate 15 provided with the positive electrode wiring conductor 12H, the bridge wiring conductor 12B, the negative electrode wiring conductor 12L, the gate signal wiring conductors (12HG and 12LG), and the source signal wiring conductors (12HS and 12LS) on the front surface and with the thermal strain relaxation conductor 22 (not shown) on the rear surface, and the respective stand-up terminals (14H, 14B, 14L, 14HG, 14HS, 14LG, and 14LS), which are not illustrated therein, is prepared and thoroughly washed with an organic solvent such as acetone and isopropanol in a first step. Here, the insulating wiring substrate 15 and the respective stand-up terminals described above are available from a ceramic substrate manufacturer and a sheet metal processor by order while adding drawings.

Subsequently, as shown in FIG. 2(*b*), the respective stand-up terminals (14H, 14B, 14L, 14HG, 14HS, 14LG, and 14LS) are bonded to predetermined positions of the wiring conductors 12H, 12B, 12L, 12HG, 12HS, 12LG, 12LS on the front surface of the insulating wiring substrate 15 in a second step by using silver solder (such as a Ag alloy with 24% Cu and 15% In) and a reduced-pressure high-temperature bonding apparatus. At this time, it is desirable to use positioning jigs made of carbon and the like in order to achieve accurate positioning of the respective stand-up terminals. The bonding method is not limited only to the silver soldering. It is also possible to employ bonding by use of solder or a conductive adhesive, bonding by use of submicron particles of Ag, Cu, and the like, laser welding, solid-phase (or liquid-phase) diffusion bonding, and so forth.

Subsequently, as shown in FIG. 2(*c*), the thoroughly washed chips of the respective power semiconductor devices (13HT and 13LT) are soldered to predetermined positions of the positive electrode wiring conductor 12H and the bridge wiring conductor 12B by using a reduced-pressure reflow apparatus in a third step. At this time, it is desirable to use the positioning jigs made of carbon and the like in order to achieve accurate positioning of the respective power semiconductor devices (13HT and 13LT). The bonding method is not limited only to the soldering. It is also possible to employ bonding by use of a conductive adhesive, bonding by use of submicron particles of Ag, Cu, and the like, solid-phase (or liquid-phase) diffusion bonding, and so forth. According to one or more embodiments of the present invention, a bonding process temperature on such a material is lower by at least 30° C. than a heatproof temperature of the power semiconductor devices (13HT and 13LT) and a heatproof temperature of the bonding material used in the above-described second step.

Lastly, in a fourth step, by use of a wire bonding device, the front surface electrodes (the source electrodes and the gate electrodes) of the respective power semiconductor devices (13HT and 13LT) are connected to the respective wiring conductors (12B, 12L, 12HG, 12HS, 12LG, and 12LS) by using the bonding wires (18BT, 18HG, 18HS, 18LT, 18LG, and 18LS) as an example of front surface bonders. Besides the bonding wires, other front surface connectors such as bonding ribbons and lead frames may also be used. Thus, the half-bridge power semiconductor module 1 shown in FIGS. 1A(a)-1A(c) is finished.

As a modified example (a first modified example) of the manufacturing method according to the first embodiment, the bonding of the respective stand-up terminals (14H, 14B, 14L, 14HG, 14HS, 14LG, and 14LS) in the second step and the bonding of the chips of the respective power semiconductor devices (13HT and 13LT) in the third step may be carried out at the same time by using the same bonding material. This case brings about an advantage that the manufacturing process is shortened and the manufacturing cost is reduced. An upper limit of the bonding process temperature is equivalent to the heatproof temperature of the power semiconductor devices (13HT and 13LT).

As another modified example (a second modified example) of the manufacturing method according to the first embodiment, it is also possible to additionally provide a step between the second step (FIG. 2(*b*)) and the third step (FIG. 2(*c*)) of coating the front surfaces of the respective wiring conductors (12B, 12L, 12HG, 12HS, 12LG, and 12LS) and the front surfaces of the respective stand-up terminals (14H, 14B, 14L, 14HG, 14HS, 14LG, and 14LS) with Ni plate by performing an electroless Ni plating process on the insulating wiring substrate 15 to which the respective stand-up terminals are bonded.

COMPARATIVE EXAMPLE

Next, operation and effect that may be obtained from the half-bridge power semiconductor module 1 in FIGS. 1A(a)-1A(c) will be described with reference to a comparative example shown in FIG. 10.

With the advent of a power semiconductor device (such as a MOSFET, a JFET, and an SBD) using wide bandgap semiconductor such as silicon carbide (SiC) and gallium nitride (GaN) as well as of a power Si-MOSFET having a super junction structure, developments of next-generation power transducers (inverters and converters) driven by fast switching in a high-voltage range from 600 V to 1.7 kV have recently been active. Being a device designed for a unipolar operation in a high voltage range is a reason why each of these power semiconductor devices can be driven by fast switching.

A first benefit of the fast switching drive is to enhance conversion efficiency by reducing switching losses of a power semiconductor device. Nonetheless, a second benefit thereof that a switching frequency (or a carrier frequency) can be increased without reducing the conversion efficiency is more important in a practical sense, because an increase in switching frequency leads to reduction in volume of a large passive component such as a coupling capacitor and a reactor, and thus to reduction in size and price of a power transducer.

In the meantime, a power module housing one or more half-bridge (power) circuits in one package as a main circuit of a power transducer to control large inductive loads of a motor, an inductor, a transformer and the like has been widely used. To put it very simple, this half-bridge (power) circuit is a circuit formed by connecting two power semiconductor device chips in series in a forward direction and locating an output terminal at a connection midpoint of these power semiconductor device chips.

However, an attempt to subject this half-bridge (power) circuit to fast switching may cause one or more of the following.

(1) A large surge voltage (or a sudden high voltage) is generated at the instant of turning off the power semiconductor device that is turned on, thereby increasing a switching loss.

(2) The surge voltage destroys the power semiconductor device.

(3) Adoption of a higher withstand voltage power semiconductor device in order to protect against this threat leads to an increase in conduction loss as well as an increase in manufacturing cost.

A reverse voltage $(=-L_s \times di/dt)$ caused by interference between parasitic inductance (self-inductance) Ls occurring on a module wiring path on which a main current (a load current) flows and a rapid change in current (di/dt) is a cause of the above.

As a method for reducing parasitic inductance on wiring, there is an electromagnetic method of cancelling parasitic inductance using a transconductance effect created by feeding currents in mutually opposite directions to two-way lines disposed adjacent to each other (see Patent Literature 1 and 2). Specifically, this is a method of forming "adjacent antiparallel conduction" by providing a parallel wiring plate having the same potential as either a high side potential or a low side potential on a rear surface of an insulating wiring substrate that includes a bridge circuit formed on its front surface, and then feeding a main current to the parallel wiring plate, which is in a direction opposite to a main current on the front surface.

Figure 10:
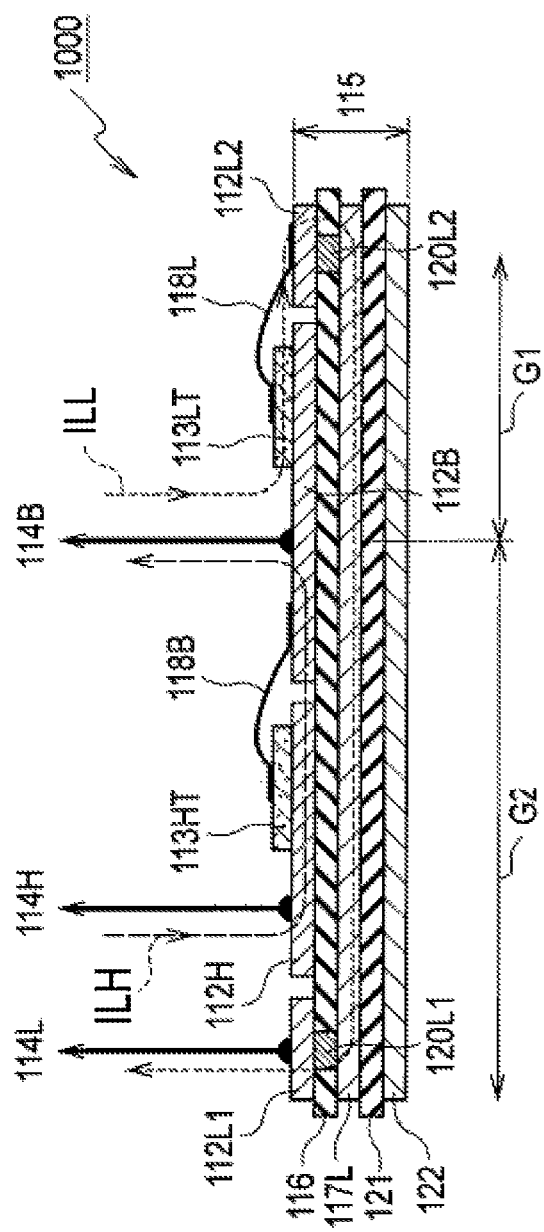
FIG. 10 is a cross-sectional view of a substantial part showing a structure of a half-bridge power module 1000 according to a comparative example.

FIG. 10 is a cross-sectional view of a substantial part of a comparative example which employs the electromagnetic method for reducing parasitic inductance inside a half-bridge power module 1000. The half-bridge power module 1000 uses an insulating wiring substrate 115 of a structure including two layers of insulating plates and three layers of conducting plates. Specifically, the insulating wiring substrate 115 includes a first insulating plate 116 and a second insulating plate 121. Front surface wiring conductors (112H, 112B, 112L1, and 112L2) are provided on a front surface of the first insulating plate 116. An intermediate wiring conductor 117L is provided between the first insulating plate 116 and the second insulating plate 121. A thermal strain relaxation conductor 122 is provided on a rear surface of the second insulating plate 121. Connecting conductors (120L1 and 120L2) are buried in openings that penetrate the first insulating plate 116. The connecting conductor 120L1 connects the front surface wiring conductor 112L1 to the intermediate wiring conductor 117L, and the connecting conductor 120L2 connects the front surface wiring conductor 112L2 to the intermediate wiring conductor 117L.

A high side terminal 114H is provided on the front surface wiring conductor 112H, a low side terminal 114L is provided on the front surface wiring conductor 112L1, and a bridge terminal 114B is provided on the front surface wiring conductor 112B.

A rear surface electrode (a drain electrode) of a high side power semiconductor device (a switching element) 113HT is bonded to the front surface wiring conductor 112H, and a rear surface electrode (a drain electrode) of a low side power semiconductor device (a switching element) 113LT is bonded to the front surface wiring conductor 112B. A front surface electrode of the high side power semiconductor device 113HT is bonded to the front surface wiring conductor 112B through a bonding wire 118B. A front surface electrode of the low side power semiconductor device 113LT is bonded to the front surface wiring conductor 112L2 through a bonding wire 118L.

However, in the structure of the power module 1000 in FIG. 10, the intermediate wiring conductor 117L and the second insulating plate 121 are inserted between the first insulating plate 116 and the thermal stress relaxation conductor 122. Accordingly, thermal resistance of the insulating wiring substrate 115 is increased as compared to a simple insulating substrate widely used today, which is formed by attaching conducting plates to two surfaces of a single-layered insulating plate. For this reason, there was deterioration in heat dissipation performance of the power semiconductor devices (113HT and 113LT), which led to a rise in bonding temperature. The second insulating plate 121 has a larger impact on the thermal resistance than that of the intermediate wiring conductor 117L, because thermal conductivity of the second insulating plate 121 is significantly low.

Operation and Effect of First Embodiment

The main currents flowing on the positive electrode wiring conductor 12H and on the high side connector (the multiple bonding wires in FIGS. 1A(a)-1A(c)) 18BT, respectively, have the same magnitude and flow in directions that are opposite to each other, dispersed, and adjacent and parallel to each other. Meanwhile, the main currents flowing on the bridge wiring conductor 12B and on the multiple bonding wires 18LT, respectively, have the same magnitude and flow in directions that are opposite to each other, dispersed, and adjacent and parallel to each other.

The bridge terminal 14B and the high side terminal 14H are disposed adjacent and parallel to each other, and so are the bridge terminal 14B and the low side terminal 14L. The main currents flowing on the high side terminal 14H and on the bridge terminal 14B, respectively, have the same magnitude and flow in directions that are opposite to each other, dispersed, and adjacent and parallel to each other. The main currents flowing on a low side terminal 14L and on the bridge terminal 14B, respectively, have the same magnitude and flow in directions that are opposite to each other, dispersed, and adjacent and parallel to each other.

Moreover, the direction of the main current flowing on the positive electrode wiring conductor 12H and the direction of the main current flowing on the high side terminal 14H form a substantially right angle. The direction of the main current flowing on a negative electrode wiring conductor 12L and the direction of the main current flowing on the low side terminal 14L form a substantially right angle.

By forming the directions of the main currents as described above, the half-bridge power semiconductor module 1 in FIGS. 1A(a)-1A(c) can realize the parasitic inductance which is equal to or lower than that of the half-bridge power module 1000 in FIG. 10.

Furthermore, the half-bridge power semiconductor module 1 in FIGS. 1A(a)-1A(c) includes the single-layered insulating plate 16, and can thus achieve the thermal resistance (the thermal resistance of the insulating wiring substrate) which is equivalent to that of a conventional half-bridge power semiconductor module using an insulating wiring substrate provided with a single-layered insulating plate, while realizing the parasitic inductance being equal to or lower than that of the half-bridge power module 1000 in FIG. 10.

Here, a reason why the half-bridge power semiconductor module 1 of the first embodiment can achieve the thermal resistance equivalent to that of the conventional half-bridge power semiconductor module will be described in detail. Generally, a large part of Joule heat generated by the power semiconductor device propagates vertically toward a radiator coupled to a lower part of the insulating wiring substrate. A sum of thermal resistance of components that constitute this propagation path is equivalent to the thermal resistance of the insulating wiring substrate.

As it is apparent with reference to the cross-sectional structure in FIG. 1A(b), the half-bridge power semiconductor module 1 of the first embodiment has the same vertical structure as that of the conventional half-bridge power semiconductor module. That is to say, the half-bridge power semiconductor module 1 uses the insulating wiring substrate 15 provided with the single-layered insulating plate 16. Accordingly, it can be said that thermal resistance of the insulating wiring substrate 15 according to the first embodiment is equal to the thermal resistance of the conventional insulating wiring substrate. Assuming that thermal resistance of the wiring conductors (12H and 12B) is Rth_C1, the thermal resistance of the insulating plate 16 is Rth_I1, and thermal resistance of the thermal strain relaxation conductor 22 is Rth_C2, then the thermal resistance Rth_sub of the insulating wiring substrate 15 is equivalent to serial connection resistance of these components:

$$Rth\_sub = Rth\_C1 + Rth\_I1 + Rth\_C2 \quad (1).$$

The thermal resistance Rth_sub of the insulating wiring substrate shown in Formula (1) is equal to that of the conventional half-bridge power semiconductor module using the insulating wiring substrate provided with the single-layered insulating plate.

On the other hand, thermal resistance Rth_sub of the comparative example (FIG. 10) can be expressed by Formula (2), in which values Rth_Cm and Rth_I2 represent thermal resistance of the intermediate wiring conductor 117L and thermal resistance of the second insulating plate 121, respectively:

$$Rth\_sub = Rth\_C1 + Rth\_I1 + (Rth\_Cm + Rth\_I2) + Rth\_C2 \quad (2).$$

As apparent by comparing Formula (1) with Formula (2), it can be said that the thermal resistance of the half-bridge power semiconductor module 1 of the first embodiment is reduced by the thermal resistance (Rth_Cm+Rth_I2) of the intermediate wiring conductor 117L and the second insulating plate 121 as compared to the comparative example (FIG. 10). Therefore, it is also understood from a mathematical point of view that the half-bridge power semiconductor module 1 has an excellent thermal performance.

Next, three reasons why the half-bridge power semiconductor module 1 of the first embodiment can realize the parasitic inductance equal to or lower than that of the comparative example (FIG. 10) will be described by using FIGS. 3A(a)-3A(d) and 3B(a)-3B(d).

To begin with, a first reason is as follows. As shown in FIGS. 3A(a) and 3A(b), when the high side power semiconductor device 13HT is turned on, for example, a main current ILH indicated with arrows and a dashed line flows on the half-bridge power semiconductor module 1. The main current ILH enters the module from the high side terminal 14H, flows on the positive electrode wiring conductor 12H, turns back at the high side power semiconductor device 13HT, passes through the high side connector (the multiple bonding wires) 18BT, and goes out of the module from the bridge terminal 14B. As described above, when the high side power semiconductor device 13HT is turned on, the main current ILH having the same magnitude but the opposite directions spreads at almost all points including the main current terminals 14H and 14B, and performs antiparallel circulation at adjacent positions. In other words, it can be said that a configuration of "adjacent antiparallel conduction" of a main current (IHL) is achieved in almost all parts of a flow path for the main current. In this way, parasitic inductance Ls occurring on the flow path for the main current, which flows when the high side power semiconductor device 13HT is turned on, can be ideally reduced in the electromagnetic perspective.

The main current ILL shown in FIGS. 3A(c) and 3A(d) indicates a main current (a commutation current) that flows when the diode built in the low side power semiconductor device (the switch) 13LT is reverse conducted. The main current ILL shown in FIGS. 3B(a) and 3B(b) indicates a main current that flows when the low side power semiconductor device (the switch) 13LT is turned on, and the main current ILH shown in FIGS. 3B(c) and 3B(d) indicates a main current (a commutation current) that flows when the diode built in the high side power semiconductor device (the switch) 13HT is reverse conducted. It can be said that, in other states of operation of the half-bridge power semiconductor module 1 as well, the main current (ILH or ILL) spreads and achieves the "adjacent antiparallel conduction" as described above and the parasitic inductance Ls occurring on the flow path for the main current is ideally reduced in the electromagnetic perspective.

Furthermore, the adjacent antiparallel conduction is realized in all the states of steady operation shown in FIGS. 3A(a)-3A(d) and 3B(a)-3B(d) on the basis of the high side region and on the basis of the low side region as described above. Accordingly, it can be said that the adjacent antiparallel conduction is achieved even in a transient state of operation (at the instant to be turned on or off) to transition from a certain state of steady operation to a different state of steady operation. For example, the phenomena of the adjacent antiparallel conduction shown in FIGS. 3B(a) to 3B(d) occur simultaneously in the transient state at the instant when the low side power semiconductor device 13LT is turned off. To be more precise, a transition occurs in such a way that the adjacent antiparallel conduction in FIGS. 3B(a) and 3B(b) is decreased while the adjacent antiparallel conduction in FIGS. 3B(c) and 3B(d) is increased. It turns out that the main current branched off to the high side and the low side realizes the adjacent antiparallel conduction on each side even in the above-mentioned transient state. The same applies to other transient states, i.e., the instant when the low side power semiconductor device 13LT is turned on and the instant when the high side power semiconductor device 13HT is turned on or turned off. This operation can extremely effectively reduce not only the voltage surge but also current ringing occurring in the transient state.

On the other hand, the structure of the power module of the comparative example (FIG. 10) inevitably develops a section where the "adjacent antiparallel conduction" of the main current is imperfect. For this reason, the reduction in parasitic inductance Ls is inhibited. As a consequence, the voltage surge cannot be reduced as intended. This has a serious impact in the case of a load with a dominant resistance component or in the case of using power modules connected in parallel.

An arrow dashed line ILL in FIG. 10 indicates a flow of the main current (a load current) when the low side power semiconductor device 113LT is turned on. The main current (ILL) is inputted from the bridge terminal 114B to the power module, passed through the front surface wiring conductor 112B, the low side power semiconductor device 113LT, the bonding wire 118L, the front surface wiring conductor 112L2, the connecting conductor 120L2, the intermediate wiring conductor 117L, the connecting conductor 120L1, and the front surface wiring conductor 112L1, and outputted from the low side terminal 114L. Here, in a first section G1 in FIG. 10, the main current (ILL) flowing on the front surface side of the insulating substrate 115 is directed opposite to the main current (ILL) flowing on the rear surface side thereof. Hence, the low parasitic inductance Ls can be realized since the effect of the "adjacent antiparallel conduction" of the main current is present. However, in a second section G2 adjacent to the first section G1, the main current (ILL) flows only on the intermediate wiring conductor 117L. Hence, large parasitic inductance Ls occurs in the second section G2 because the effect of the "adjacent antiparallel conduction" of the main current is absent.

An arrow dashed line ILH in FIG. 10 indicates a flow of the main current (the load current) when the high side power semiconductor device 113HT is turned on. The main current (ILH) is inputted from the high side terminal 114H to the power module, passed through the front surface wiring conductor 112H, the high side power semiconductor device 113HT, the bonding wire 118B, and the front surface wiring conductor 112B, and outputted from the bridge terminal 114B. Here, it should be noted that the main current (ILH) does not flow on the intermediate wiring conductor 117L at all, and there is no effect of the "adjacent antiparallel conduction". In other words, when the high side power semiconductor device 113H is turned on, the current path (114H, 112H, 113HT, 118B, 112B, and 114B) of the main current (ILH) is in a high state of the parasitic inductance Ls.

Likewise, the second section G2 also has large parasitic inductance Ls when the high side power semiconductor device 113HT or the low side power semiconductor device 113LT is in a commutation mode (a reverse conduction mode).

As described above, the section G2 where no "adjacent antiparallel conduction" is established as in the comparative example does not exist in the first embodiment. For this reason, the first embodiment is capable of reducing the parasitic inductance Ls more effectively than the comparative example in any load conditions.

A second reason why it is possible to realize the low parasitic inductance is that the flow path for the main current is shorter than that in the comparative example. In the comparative example (FIG. 10), the first insulating plate 116 needs to be provided with two connection ports (the connecting conductors 120L1 and 120L2) in order to feed the main current to the intermediate wiring conductor 117L. Accordingly, the flow path for the main current becomes longer than that in the first embodiment (FIG. 1A(b)) not provided with connection ports. A short current flow path has an effect to reduce parasitic inductance. Therefore, the first embodiment can make the parasitic inductance smaller than that in the comparative example. In addition, provision of the shorter flow path for the main current than that in the comparative example can also bring about another advantage of being capable of reducing dimensions of the module.

A third reason why it is possible to realize the low parasitic inductance is that a distance between the two main currents (an outbound current and an inbound current) flowing in an antiparallel manner is shorter than that in the comparative example. The insulating plate 116 is sandwiched between the two main currents in the comparative example (FIG. 10). On the other hand, the insulating plate 16 is not sandwiched between the two main currents in the first embodiment (FIG. 1A(b)). The first embodiment can bring the two main currents (the outbound current and the inbound current) closer to each other by an amount corresponding to the thickness of the insulating plate 116. Due to this proximity effect, the first embodiment can achieve the smaller parasitic inductance than that in the comparative example.

The above-mentioned operation and effect may be common to other embodiments and modified examples to be described below.

Second Embodiment

The first embodiment shows the case of the half-bridge power semiconductor module in which both of the high side power semiconductor device 13HT and the low side power semiconductor device 13LT are the switching elements (i.e., the transistors such as the MOSFETs and the JFETs). However, a half-bridge power semiconductor module in which one of the high side power semiconductor device and the low side power semiconductor device is a diode while the other one is a transistor can also reduce the parasitic inductance Ls likewise, and can consequently reduce the surge voltage generated by turning on the transistor.

A second embodiment of the present invention relates to a half-bridge power semiconductor module 2 including a diode on one side and a transistor on the other side, which is widely used in a DC-DC converter and the like called a boost chopper or a step-down chopper.

A configuration of the half-bridge power semiconductor module 2 according to the second embodiment will be described with reference to FIGS. 4A(a)-4A(c) and 4B(a)-4B(b). FIG. 4A(a) is a plan view of the half-bridge power semiconductor module 2, FIG. 4A(b) is a cross-sectional view taken along the A-A' cutting line in FIG. 4A(a), and FIG. 4A(c) is a cross-sectional view taken along the B-B' cutting line in FIG. 4A(a). FIG. 4B(a) is a cross-sectional view taken along the C-C' cutting line in FIG. 4A(a), and FIG. 4B(b) is a circuit representation diagram of the half-bridge power semiconductor module 2.

The half-bridge power semiconductor module 2 includes a high side power semiconductor device (a switch) 13HT on a high side, and a fast commutation power diode 13LD on a low side. The fast commutation power diode 13LD is either a Schottky power diode or a fast p-n diode. A rear surface electrode (a cathode electrode) of the fast commutation power diode 13LD is die-bonded to a front surface of the bridge wiring conductor 12B by using solder or the like. Meanwhile, a rear surface electrode (an anode electrode) of the fast commutation power diode 13LD is connected to the low side terminal 14L by using a low side connector (multiple bonding wires in FIG. 4A(a)) 18LD. Other connectors including bonding ribbons, lead frames, and the like may be used for the low side connector 18LD. The high side power semiconductor device (the switch) 13HT may also be a unipolar switch or a bipolar switch not having a built-in reverse conducting diode.

The half-bridge power semiconductor module 2 includes the insulating wiring substrate 15 provided with the single-layered insulating plate 16 which is the same as the one in the half-bridge power semiconductor module 1. Since the fast commutation power diode 13LD does not have a gate electrode, the insulating wiring substrate 15 does not include the gate signal wiring conductor (12LG) or the source signal wiring conductor (12LS) on the low side. Except for this feature, the insulating wiring substrate 15 has the same configuration as the wiring substrate 15 in FIG. 1A(a).

Moreover, there are no bonding wires (18LG and 18LS) or gate/source signal terminals (14LG and 14LS) on the low side in the half-bridge power semiconductor module 2, either.

Configurations corresponding to other reference signs are the same as those in FIGS. 1A(a)-1A(c) and 1B(a)-1B(b), and description thereof will be omitted. Here, usually in the step-down chopper, a positive electrode of a direct-current power supply is connected to the high side terminal 14H, a negative electrode of the direct-current power supply is connected to the low side terminal 14L, and an energy accumulation coil and a smoothing capacitor coupled in series are connected between the bridge terminal 14B and the low side terminal 14L. A stepped-down direct-current voltage is outputted from two ends of the smoothing capacitor.

Next, the half-bridge power semiconductor module 2 in FIGS. 4A(a)-4A(c) and 4B(a)-4B(b) can be manufactured by the same method as the manufacturing method of the first embodiment described with reference to FIGS. 2(a) to 2(c). However, the insulating wiring substrate 15 in FIGS. 2(a) to 2(c) should be replaced with the insulating wiring substrate 15 having the configuration in FIGS. 4A(a)-4A(c), the low side power semiconductor device (the switch) 13LT should be replaced with the fast commutation power diode 13LD, the bonding wires 18LT are replaced with the bonding wires 18LD, and the wiring conductors (12LG and 12LS), the bonding wires (18LG and 18LS), and the signal terminals (14LG and 14LS) should be deleted.

Operation and effect of the second embodiment will be described. The main current (the load current) ILH that flows when the high side power semiconductor device 13HT is turned on is the same as that shown in FIGS. 3A(a) and 3A(b), and a similar effect to the effect described in the first embodiment is obtained therefrom. Meanwhile, after the high side power semiconductor device 13HT is turned off, a commutating main current (a commutation current) ILL as indicated with a dashed line in FIGS. 4A(a)-4A(c) flows in the low side region including the fast commutation power diode (the low side power semiconductor device) 13LD. The flow of the commutating main current (the commutation current) ILL is the adjacent antiparallel conduction as in FIGS. 3A(c) and 3A(d), and it turns out that the parasitic inductance is reduced in the low side region as well.

Moreover, in a transient state at the instant when the high side power semiconductor device 13HT is turned on or turned off, the main currents (ILH and ILL) indicated with dashed lines in FIGS. 3A(a), 3A(b), and 4A flow simultaneously in the high side region and the low side region. At this time, the adjacent antiparallel conduction is realized in each of the high side and low side regions. Accordingly, the operation to reduce the parasitic inductance is fully exerted. This brings about an effect to reduce the surge voltage on the high side power semiconductor device 13HT at the instant of being turned off. In addition, there is also obtained an advantage of being capable of reducing current and voltage ringing occurring in a main circuit at the instant of being turned on or turned off.

Third Embodiment

Depending on attributes of the high side power semiconductor device (the switch) or the low side power semiconductor device (the switch) used in the half-bridge power semiconductor module, there may be a situation where it is necessary to provide the power semiconductor device (the switch) with a fast commutation power diode FWD (a Schottky diode or a fast p-n diode) in an antiparallel fashion. Cases that correspond to such a situation include, for example: a case of a bipolar power semiconductor device such as an IGBT which is difficult in principle to be reverse conducted; a case of a power semiconductor device (a switch) being of a unipolar type but not having a built-in reverse conducting diode; a case where current rating of a reverse conducting diode built in a power semiconductor device (a switch) is short of capacity; a case where it is not desired to put a built-in diode to reverse conduction for some reason; and so forth. As described below, one or more embodiments of the present invention is also applicable to the above-mentioned cases.

The third embodiment has a configuration in which at least one of the high side power semiconductor device and the low side power semiconductor device includes a power switching element (13HT or 13LT) and a commutation power diode (13HD or 13LD) connected antiparallel to the power switching element. If the power switching element (13HT or 13LT) has a built-in reverse conducting diode, then an appropriate power diode (13HD or 13LD) is supposed to be selected so as to render a rated operating voltage of the power diode sufficiently lower than an operating voltage of the built-in reverse conducting diode in order to achieve the expected purpose.

FIGS. 5(a)-5(c) show a configuration of a half-bridge power semiconductor module 3 according to the third embodiment. FIG. 5(a) is a plan view of the half-bridge power semiconductor module 3, FIG. 5(b) is a plan view of the insulating wiring substrate 15 alone which is used in FIG. 5(a), and FIG. 5(c) is a circuit representation diagram of the half-bridge power semiconductor module 3. Cross-sectional structures taken along the A1-A1' line and the A2-A2' line drawn in FIG. 5(a) are substantially the same as the cross-sectional view taken along the A-A' line in FIG. 4A(b), and cross-sectional structures taken along the B1-B1' line and the B2-B2' line in FIG. 5(a) are substantially the same as the cross-sectional view taken along the B-B' line in FIG. 4A(c). Accordingly, illustration of the cross sections will be omitted.

As with the first and second embodiments, the half-bridge power semiconductor module 3 has a basic configuration of bridge-connecting the high side region and the low side region which are constructed on the insulating wiring substrate 15 provided with one (single-layered) insulating layer.

Specifically, the high side power semiconductor device (the switch) 13HT and the high side power semiconductor device (the diode) 13HD which are connected in antiparallel are disposed in the high side region of the half-bridge power semiconductor module 3. Rear surface electrodes (a drain electrode and a cathode electrode) of the high side power semiconductor device (the switch) 13HT and the high side power semiconductor device (the diode) 13HD are electrically and mechanically bonded to predetermined positions of the positive electrode wiring conductor 12H by using solder and the like. Front surface main electrodes (a drain electrode and a cathode electrode) of the high side power semiconductor device (the switch) 13HT and the high side power semiconductor device (the diode) 13HD are connected to insteps of the bridge terminal 14B through high side connectors 18BT and 18BD such as the bonding wires. The positive electrode wiring conductor 12H is divided by a slit 26H into a switch region 12H(T) to place the high side power semiconductor device (the switch) 13HT and a diode region 12H(D) to place the high side power semiconductor device (the diode) 13HD.

Likewise, the low side power semiconductor device (the switch) 13LT and the low side power semiconductor device (the diode) 13LD which are connected in antiparallel are disposed in the low side region of the half-bridge power semiconductor module 3. Rear surface electrodes of the low side power semiconductor device (the switch) 13LT and the low side power semiconductor device (the diode) 13LD are electrically and mechanically bonded to predetermined positions of the bridge wiring conductor 12B by using solder and the like. Front surface main electrodes (a drain electrode and a cathode electrode) of the low side power semiconductor device (the switch) 13LT and the low side power semiconductor device (the diode) 13LD are connected to insteps of the low side terminal 14L through low side connectors 18LT and 18LD such as bonding wires. The bridge wiring conductor 12B is divided by a slit 26B into a switch region 12B(T) to place the low side power semiconductor device (the switch) 13LT and a diode region 12B(D) to place the low side power semiconductor device (the diode) 13LD.

The following operation and effect may be brought about by providing the slits (26H and 26B). Specifically, the slit 26H is capable of bringing a center-of-gravity line of the main current flowing in one direction on the positive electrode wiring conductor 12H(T) (or 12H(D)) adjacent to (or coincident with) a center-of-gravity line of the main current flowing in an opposite direction on a high side connector (multiple bonding wires in FIG. 5(a)) 18HT (or 18HD), thus further reducing the parasitic inductance in the high side region. Likewise, the slit 26B is capable of bringing a center-of-gravity line of the load current flowing on the positive electrode wiring conductor 12B(T) (or 12B(D)) adjacent to (or coincident with) a center-of-gravity line of the load current flowing in an opposite direction on multiple bonding wires 18LT (or 18LD), thus further reducing the parasitic inductance in the low side region.

Other constituent members are the same as those in FIGS. 1A(a)-1A(c) and 1B(a)-1B(b) or in FIGS. 4A(a)-4A(c) and 4B(a)-4B(b), and description thereof will be omitted.

In the meantime, a manufacturing process for the half-bridge power semiconductor module 3 according to the third embodiment is not different from the manufacturing process for the half-bridge power semiconductor module 1 explained by using FIGS. 2(a)-2(c), and description thereof will be omitted.

As with the first embodiment and the second embodiment, the half-bridge power semiconductor module 3 according to the third embodiment includes the insulating wiring substrate 15 having the configuration in which the various wiring conductors and the thermal strain relaxation conductor 22 are attached to the two surfaces of the single-layered insulating plate 16. Thus, the half-bridge power semiconductor module 3 realizes the thermal resistance, which is lower than that of the insulating wiring substrate 115 of the comparative example (FIG. 10) including the two layers of the insulating plates and the three layers of the conductor layers, and is exactly equivalent to that of the conventional power semiconductor module.

Arrow dashed lines in FIGS. 6(a) to 6(d) indicate flows of the main currents (ILH and ILL) flowing in a state of steady operation of the half-bridge power semiconductor module 3 according to the third embodiment. Specifically, FIG. 6(a) indicates the main current (ILH) flowing when the high side power semiconductor device (the switch) 13HT is turned on. FIG. 6(b) indicates the main current (ILL) flowing when the low side power diode 13LD is reverse conducted (commutated). FIG. 6(c) indicates the main current (ILL) flowing when the low side power semiconductor device (the switch) 13LT is turned on. FIG. 6(d) indicates the main current (ILH) flowing when the high side power diode 13HD is reverse conducted (commutated). It is confirmed that the half-bridge power semiconductor module 3 fulfills conditions for the adjacent antiparallel conduction in all the four basic states of steady operation on the insulating wiring substrate 15 and on the main terminals (14H, 14B, and 14L).

As described above, it can be said that the third embodiment reduces the parasitic inductance and the thermal resistance inside the power module at the same time as with the first embodiment and the second embodiment.

At the instant when the high side power semiconductor device (the switch) 13HT is turned off, the main currents (ILH and ILL) flow simultaneously in such a way that the main current ILH (FIG. 6(a)) is gradually decreased while the main current ILL (FIG. 6(b)) of the power diode 13LD in FIG. 6(b) is increased. Even in such a transient state, the main currents (ILH and ILL) achieve the adjacent antiparallel conduction in the high side and low side regions, respectively. Accordingly, the parasitic inductance becomes smaller even in the transient state, and makes it possible to exert the effect of suppressing occurrence of the surge voltage to be applied to the high side power semiconductor device (the switch) 13HT as a consequence.

In the meantime, at the instant when the low side power semiconductor device (the switch) 13LT is turned off as well, the main currents (ILH and ILL) flow simultaneously in such a way that the main current ILL (FIG. 6(c)) is gradually decreased while the main current ILH (FIG. 6(b)) of the power diode 13HD is increased. Even in such a transient state, the main currents (ILH and ILL) achieve the adjacent antiparallel conduction in the high side and low side regions, respectively. Accordingly, the parasitic inductance becomes smaller, and makes it possible to exert the effect of suppressing occurrence of the surge voltage to be applied to the low side power semiconductor device (the switch) 13LT as a consequence.

Furthermore, since the adjacent antiparallel conduction is achieved in the high side and the low side regions, respectively, the state of low parasitic inductance is also maintained at the instant when the power semiconductor devices (the switches) 13HT and 13LT are turned on. In other words, the parasitic inductance in the half-bridge power semiconductor module 3 of the third embodiment is kept low both at the instant of turning on and at the instant of turning off the power semiconductor devices (the switches) 13HT and 13LT. Accordingly, it is possible to suppress current ringing and voltage ringing caused by the parasitic inductance and a rapid change in main current.

Modified Example 1

Now, Modified Example 1 of the third embodiment will be described. FIG. 7(a) is a plan view showing a configuration of a half-bridge power semiconductor module 3-1 according to Modified Example 1, and FIG. 7(b) is a plan view of the insulating wiring substrate 15 used in the half-bridge power semiconductor module 3-1. A cross-sectional structure of a substantial part is not basically different from FIGS. 1A(b), 1A(c), and 1B(a), so that illustration is omitted herein. Moreover, a circuit representation diagram is the same as FIG. 5(c) and illustration is omitted herein.

A description will be given of differences between the half-bridge power semiconductor module 3 (FIGS. 5(a)-5(c)) and the half-bridge power semiconductor module 3-1 (FIGS. 7(a)-7(b)) according to Modified Example 1. A first difference is in that locations of the low side power semiconductor device (the switch) 13LT and the low side power semiconductor device (the diode) 13LD are interchanged. By interchanging the positions, layouts on the high side and the low side are substantially symmetrically arranged with respect to input-output terminals (14H, 14B, and 14L). For this reason, according to Modified Example 1, it is possible to obtain an effect of favorably achieving an overall balance of parasitic inductance between the high side and the low side as compared to the half-bridge power semiconductor module 3.

In addition, a second difference to be described below derives from the first difference. Specifically, the gate signal terminal 14LG and the source signal terminal 14LS on the low side move downward whereby a space is created above the bridge wiring conductor 12B(D). This brings about an advantage of being capable of reducing a vertical dimension of the insulating wiring substrate (the module) 15.

A half-bridge power semiconductor module is often used for an application to continuously output power pulses of the same polarity, such as a DC-DC converter to perform PWM modulation and a PWM inverter to output a sinusoidal waveform. In this case, an operation is repeated to turn the switch on one side (such as the high side) on or off to cause commutation of the diode on the other side (such as the low side). In the case of the above-described operating mode, the half-bridge power semiconductor module 3 (FIGS. 5(a)-5(c)) of the third embodiment has smaller adverse effects on the imbalance of the parasitic inductance and is therefore superior to the half-bridge power semiconductor device module 3-1 (FIGS. 7(a)-7(b)) of Modified Example 1. As seen from this example, the best embodiment or modified example thereof may be selected depending on the use. This principle applies to all the embodiments in common.

A manufacturing process for the half-bridge power semiconductor module 3-1 of Modified Example 1 is the same as that of the first embodiment (FIGS. 2(a)-2(c)), and description thereof will be omitted.

Fourth Embodiment

The first to third embodiment and in the modified examples thereof have the configuration in which the bridge terminal 14B is disposed at the center of the high side region and of the low side region. However, the present invention is not limited only to this layout. A fourth embodiment of the present invention has a configuration in which the bridge terminal 14B is not disposed at the center.

FIGS. 8A(a)-8A(b) and 8B(a)-8B(d) show a structure of a half-bridge power semiconductor module 4 according to the fourth embodiment. While the half-bridge power semiconductor module 4 represents an example of changing the layout of the first embodiment (FIGS. 1A(a)-1A(c) and 1B(a)-1B(b)), the inventor would like first to mention that the layouts of the second embodiment and the third embodiment can also be changed based on the same concept. FIG. 8A(a) is a plan view, FIG. 8B(a) is a cross-sectional view taken along the A-A' line in FIG. 8A(a), FIG. 8B(b) is a cross-sectional view taken along the B-B' line in FIG. 8A(a), FIG. 8B(c) is a cross-sectional view taken along the C-C' line in FIG. 8A(a), and FIG. 8B(d) is a cross-sectional view taken along the D-D' line in FIG. 8A(a). FIG. 8A(b) is a plan view of the insulating wiring substrate 15 alone. The circuit representation diagram is the same as FIG. 1B(b) shown above, and illustration thereof will therefore be omitted. Elements in FIGS. 8A(a)-8B(d) denoted by the same reference signs as those in FIGS. 1A(a)-1B(b) are the same as the elements in FIGS. 1B(a)-1B(b), and description thereof will be either omitted or kept within simple explanation.

The insulating wiring substrate 15 is a single-layered insulating wiring substrate, which includes the various wiring conductors (the positive electrode wiring conductor 12H, the bridge wiring conductor 12B, and the negative electrode wiring conductors 12L, 12HG, 12HS, 12LG, and 12LS) attached to the front surface of the insulating plate 16, and the thermal strain wiring conductor 22 attached to the rear surface of the insulating plate 16. As shown in FIG. 8A(b), the bridge wiring conductor 12B is branched and present in the high side region and the low side region.

Each of the high side power semiconductor device (the switch) 13HT and the low side power semiconductor device (the switch) 13LT has a built-in reverse conducting diode. The rear surface of the high side power semiconductor device (the switch) 13HT is bonded to the positive electrode wiring conductor 12H, and the rear surface of the low side power semiconductor device (the switch) 13LT is bonded to the bridge wiring conductor 12B.

The bridge terminal 14B is a stand-up terminal, which is bonded to the bridge wiring conductors 12B in the high side region and the low side region. The high side terminal 14H is a stand-up terminal, which is bonded to the positive electrode wiring conductor 12H, brought close to the bridge terminal 14B, and located between the bridge terminal 14B and the high side power semiconductor device (the switch) 13HT. The low side terminal 14L is a stand-up terminal, which is bonded to the negative electrode wiring conductor 12L, brought close to the bridge terminal 14B, and located between the bridge terminal 14B and the low side power semiconductor device (the switch) 13LT.

The high side connector 18BT connects the front surface electrode (the source or emitter electrode) of the high side power semiconductor device (the switch) 13HT to insteps of the stand-up bridge terminal 14B. The low side connector 18LT connects the front surface electrode (the source or emitter electrode) of the low side power semiconductor device (the switch) 13LT to the insteps of the stand-up low side terminal 14L.

The half-bridge power semiconductor module 4 according to the fourth embodiment can be manufactured in accordance with the manufacturing process described by using FIGS. 2(a)-2(c), and explanation of the manufacturing process will be omitted.

As shown in FIGS. 8B(a) to 8B(d), the half-bridge power semiconductor module 4 according to the fourth embodiment includes the insulating wiring substrate 15 having the various wiring conductors and the thermal strain relaxation conductor 22 attached to the two surfaces of the single-layered insulating plate 16. Thus, it can be said that the half-bridge power semiconductor module 4 realizes the thermal resistance, which is lower than that of the insulating wiring substrate 115 of the comparative example (FIG. 10) including the two layers of the insulating plates and the three layers of the conductor layers, and is exactly equivalent to that of the conventional power semiconductor module.

Arrows and dashed lines illustrated in FIGS. 9(a) to 9(d) indicate the main currents (ILH and ILL) flowing in four states of steady operation of the half-bridge power semiconductor module 4. It turns out that the half-bridge power semiconductor module 3 fulfills the conditions for the adjacent antiparallel conduction in all the states of steady operation and on the insulating wiring substrate 15 as well as on the main terminals 14H, 14B, and 14L. Accordingly, it can be said that the half-bridge power semiconductor module 4 according to the fourth embodiment achieves the low parasitic inductance equivalent to that of the half-bridge power semiconductor module 1 of the first embodiment.

As the parasitic inductance in the main circuit becomes small, it is possible to significantly reduce the surge voltage generated at the instant of turning off the power semiconductor device (the switch) inside. Furthermore, it is possible to suppress current ringing and voltage ringing caused by the parasitic inductance and a rapid change in main current.

The details of the present invention have been described above in accordance with the embodiments. However, the present invention is not limited only to this description, and it is obvious to those skilled in the art that various modifications and alterations are possible.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

REFERENCE SIGNS LIST

1 to 4, 3-1 HALF-BRIDGE POWER SEMICONDUCTOR MODULE
12H, 12H(T), 12H(D) POSITIVE ELECTRODE WIRING CONDUCTOR
12L, 12L(T), 12L(D) NEGATIVE ELECTRODE WIRING CONDUCTOR
12B, 12B(T), 12B(D) BRIDGE WIRING CONDUCTOR
12HG, 12LG GATE (BASE) SIGNAL WIRING CONDUCTOR
12HS, 12LS SOURCE (EMITTER) SIGNAL WIRING CONDUCTOR
13HT HIGH SIDE POWER SEMICONDUCTOR DEVICE (SWITCH)
13HD HIGH SIDE POWER SEMICONDUCTOR DEVICE (DIODE FWD)
13LT LOW SIDE POWER SEMICONDUCTOR DEVICE (SWITCH)
13LD LOW SIDE POWER SEMICONDUCTOR DEVICE (DIODE FWD)
14H STAND-UP HIGH SIDE TERMINAL
14L STAND-UP LOW SIDE TERMINAL
14B STAND-UP BRIDGE TERMINAL
14HG, 14LG STAND-UP GATE SIGNAL TERMINAL
14HS, 14LS STAND-UP SOURCE SIGNAL TERMINAL
15 INSULATING WIRING SUBSTRATE
16 INSULATING PLATE
18BT, 18BD HIGH SIDE CONNECTOR (MULTIPLE BONDING WIRES, AND THE LIKE)
18LT, 18LD LOW SIDE CONNECTOR (MULTIPLE BONDING WIRES, AND THE LIKE)
18HG, 18LG GATE SIGNAL CONNECTOR (MULTIPLE BONDING WIRES, AND THE LIKE)
18HS, 18LS SOURCE SIGNAL CONNECTOR (MULTIPLE BONDING WIRES, AND THE LIKE)
ILH, ILL MAIN CURRENT

The invention claimed is:

1. A switching control half-bridge power semiconductor module comprising:
    an insulating wiring substrate comprising:
        a single insulating plate, and
        a positive electrode wiring conductor, a bridge wiring conductor, and multiple negative electrode wiring conductors disposed on or above the insulating plate while being electrically isolated from one another;
    at least one high side power semiconductor device having a rear surface electrode bonded onto the positive electrode wiring conductor;
    at least one low side power semiconductor device having a rear surface electrode bonded onto the bridge wiring conductor;
    a stand-up multiple-legged bridge terminal connected to the bridge wiring conductor;
    a stand-up multiple-legged high side terminal disposed between the high side power semiconductor device and the stand-up multiple-legged bridge terminal, and connected to the positive electrode wiring conductor;
    a stand-up multiple-legged low side terminal disposed between the stand-up multiple-legged bridge terminal and the low side power semiconductor device, and connected to the negative electrode wiring conductors;
    a high side connector connecting a front surface main electrode of the high side power semiconductor device to the stand-up multiple-legged bridge terminal; and
    a low side connector connecting a front surface main electrode of the low side power semiconductor device to the stand-up multiple-legged low side terminal.

2. The switching control half-bridge power semiconductor module according to claim 1, wherein the switching control half-bridge power semiconductor module is configured to have main currents flowing on the positive electrode wiring conductor and on the high side connector, respectively, having the same magnitude and having directions opposite and substantially parallel to each other.

3. The switching control half-bridge power semiconductor module according to claim 1, wherein the switching control half-bridge power semiconductor module is configured to have main currents flowing on the bridge wiring conductor and on the low side connector, respectively, having the same magnitude and having directions opposite and parallel to each other.

4. The switching control half-bridge power semiconductor module according to claim 1, wherein the stand-up multiple-legged bridge terminal, the stand-up multiple-legged high side terminal, and the stand-up multiple-legged low side terminal are disposed adjacent and parallel to one another.

5. The switching control half-bridge power semiconductor module according to claim 1, wherein the switching control half-bridge power semiconductor module is configured to have main currents flowing on the stand-up multiple-legged high side terminal and on the stand-up multiple-legged bridge terminal, respectively, having the same magnitude and having directions opposite and parallel to each other.

6. The switching control half-bridge power semiconductor module according to claim 1, wherein the switching control half-bridge power semiconductor module is configured to have main currents flowing on the stand-up multiple-legged low side terminal and on the stand-up multiple-legged bridge terminal, respectively, having the same magnitude and having directions opposite and parallel to each other.

7. The switching control half-bridge power semiconductor module according to claim 1, wherein a distance between the high side power semiconductor device and the stand-up multiple-legged high side terminal is equal to a distance between the low side power semiconductor device and the stand-up multiple-legged low side terminal.

8. The switching control half-bridge power semiconductor module according to claim 1, wherein at least one of the high side power semiconductor device and the low side power semiconductor device is a switching power element.

9. The switching control half-bridge power semiconductor module according to claim 1,
wherein the insulating wiring substrate further comprises a gate signal wiring conductor and a source signal wiring conductor which are disposed on the insulating plate,
wherein the switching control half-bridge power semiconductor module further comprises:
a stand-up gate signal terminal connected to the gate signal wiring conductor,
a stand-up source signal terminal connected to the source signal wiring conductor,
a gate signal connector connecting at least one of gate electrodes of the high side power semiconductor device and of the low side power semiconductor device to one of the gate signal wiring conductor and the stand-up gate signal terminal, and
a source signal connector connecting at least one of source electrodes of the high side power semiconductor device and of the low side power semiconductor device to one of the source signal wiring conductor and the stand-up source signal terminal,
wherein the gate signal connector and the source signal connector are disposed parallel to each other,
wherein the stand-up gate signal terminal and the stand-up source signal terminal are disposed parallel to each other, and
wherein gate signal currents at the same amount are arranged to flow antiparallel to each other.

10. The switching control half-bridge power semiconductor module according to claim 1,
wherein at least one of the high side power semiconductor device and the low side power semiconductor device comprises:
a power switching element; and
a power diode connected antiparallel to the power switching element.

11. The switching control half-bridge power semiconductor module according to claim 10, wherein a slit to partition between the power switching element and the power diode is formed in at least one of the positive electrode wiring conductor and the bridge wiring conductor.

12. The switching control half-bridge power semiconductor module according to claim 10, comprising:
two or more of the high side power semiconductor devices,
wherein the bridge wiring conductor and the low side connector are arranged in one direction so as to cause centers of gravity of main currents flowing on the positive electrode wiring conductor and the high side connector, respectively, to coincide with each other.

13. The switching control half-bridge power semiconductor module according to claim 10, comprising:
two or more of the low side power semiconductor devices,
wherein the bridge wiring conductor and the low side connector are arranged in one direction so as to cause centers of gravity of main currents flowing on the bridge wiring conductor and the low side connector, respectively, to coincide with each other.

14. The switching control half-bridge power semiconductor module according to claim 1, wherein the negative electrode wiring conductors are surrounded by the bridge wiring conductor with a clearance therebetween when viewed in a normal direction to a principal surface of the insulating plate.

15. The switching control half-bridge power semiconductor module according to claim 1,
wherein each of the stand-up multiple-legged high side terminal and the stand-up multiple-legged low side terminal comprises:
a base portion in a flat plate shape standing up in a normal direction to a principal surface of the insulating plate; and
multiple legs branched off from the base portion, and
wherein insteps of the multiple legs are connected to the positive electrode wiring conductor and the negative electrode wiring conductors.

16. A method for manufacturing a switching control half-bridge power semiconductor module comprising:
an insulating wiring substrate comprising:
a single insulating plate, and
a positive electrode wiring conductor, a bridge wiring conductor, and multiple negative electrode wiring conductors disposed on or above the insulating plate while being electrically isolated from one another,
at least one high side power semiconductor device having a rear surface electrode bonded onto the positive electrode wiring conductor,
at least one low side power semiconductor device having a rear surface electrode bonded onto the bridge wiring conductor,
a stand-up multiple-legged bridge terminal connected to the bridge wiring conductor,
a stand-up multiple-legged high side terminal disposed between the high side power semiconductor device and the stand-up multiple-legged bridge terminal, and connected to the positive electrode wiring conductor,
a stand-up multiple-legged low side terminal disposed between the stand-up multiple-legged bridge terminal and the low side power semiconductor device, and connected to the negative electrode wiring conductors,
a high side connector connecting a front surface main electrode of the high side power semiconductor device to the stand-up multiple-legged bridge terminal, and
a low side connector connecting a front surface main electrode of the low side power semiconductor device to the stand-up multiple-legged low side terminal,
wherein the method comprises:
a first step of preparing the insulating wiring substrate at least provided with the positive electrode wiring conductor, the bridge wiring conductor, and the negative electrode wiring conductors;
a second step, subsequent to the first step, of connecting the stand-up multiple-legged bridge terminal to the bridge wiring conductor, connecting the stand-up multiple-legged high side terminal to the positive electrode wiring conductor, and connecting the stand-up multiple-legged low side terminal to the negative electrode wiring conductors;
a third step, subsequent to the second step, of bonding a rear surface electrode of the high side power semiconductor device onto the positive electrode wiring conductor and bonding a rear surface electrode of the low side power semiconductor device onto the bridge wiring conductor; and
a fourth step, subsequent to the third step, of connecting a front surface electrode of the high side power semiconductor device to the bridge wiring conductor by using the high side connector and connecting a front surface electrode of the low side power semiconductor device to the negative electrode wiring conductors by using the low side connector.

17. The method for manufacturing a switching control half-bridge power semiconductor module according to claim 16,
wherein the second step further comprises connecting a stand-up gate signal terminal to a gate signal wiring conductor and connecting a stand-up source signal terminal to a source signal wiring conductor.

18. The method for manufacturing a switching control half-bridge power semiconductor module according to claim 16, wherein
the fourth step further comprises:
connecting one of a gate electrode of the high side power semiconductor device and a gate electrode of the low side power semiconductor device to one of a gate signal wiring conductor and a stand-up gate signal terminal by using a gate signal connector, and
connecting one of a source electrode of the high side power semiconductor device and a source electrode of the low side power semiconductor device to one of a source signal wiring conductor and a stand-up source signal terminal by using a source signal connector.

* * * * *